US008809829B2

(12) United States Patent
Lee

(10) Patent No.: US 8,809,829 B2
(45) Date of Patent: Aug. 19, 2014

(54) PHASE CHANGE MEMORY HAVING STABILIZED MICROSTRUCTURE AND MANUFACTURING METHOD

(75) Inventor: Ming-Hsiu Lee, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 433 days.

(21) Appl. No.: 12/484,955

(22) Filed: Jun. 15, 2009

(65) Prior Publication Data
US 2010/0314601 A1 Dec. 16, 2010

(51) Int. Cl.
*H01L 47/00* (2006.01)
(52) U.S. Cl.
USPC .............. 257/4; 257/2; 257/3; 257/5; 257/42; 257/774; 257/202; 438/54; 438/129; 438/131; 438/585; 365/163
(58) Field of Classification Search
CPC ....... H01L 45/144; H01L 45/06; H01L 45/04; H01L 27/2427; H01L 45/141; H01L 45/143; H01L 45/1226; H01L 45/1233; H01L 45/1641; H01L 45/1625; H01L 45/1245
USPC .............. 257/2–5, 42, 774, 202; 438/54, 129, 438/131, 585; 365/163
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 3,846,767 A | 11/1974 | Cohen | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |

(Continued)

FOREIGN PATENT DOCUMENTS

WO  WO-2004025659 A1  3/2004

OTHER PUBLICATIONS

"Magnetic Bit Boost," www.sciencenews.org, Dec. 18 & 25, 2004, p. 389, vol. 166.

(Continued)

*Primary Examiner* — Fernando L Toledo
*Assistant Examiner* — Mohammed Shamsuzzaman
(74) *Attorney, Agent, or Firm* — Yiding Wu; Haynes Beffel & Wolfeld LLP

(57) ABSTRACT

A memory device having a phase change material element with a modified stoichiometry in the active region does not exhibit drift in set state resistance. A method for manufacturing the memory device includes first manufacturing an integrated circuit including an array of phase change memory cells with bodies of phase change material having a bulk stoichiometry; and then applying forming current to the phase change memory cells in the array to change the bulk stoichiometry in active regions of the bodies of phase change material to the modified stoichiometry, without disturbing the bulk stoichiometry outside the active regions. The bulk stoichiometry is characterized by stability under the thermodynamic conditions outside the active region, while the modified stoichiometry is characterized by stability under the thermodynamic conditions inside the active region.

8 Claims, 18 Drawing Sheets

(56) References Cited

U.S. PATENT DOCUMENTS

| | | | |
|---|---|---|---|
| 5,332,923 A | 7/1994 | Takeuchi et al. | |
| 5,341,328 A * | 8/1994 | Ovshinsky et al. | 365/163 |
| 5,391,901 A | 2/1995 | Tanabe et al. | |
| 5,515,488 A | 5/1996 | Hoppe et al. | |
| 5,534,712 A | 7/1996 | Ovshinsky et al. | |
| 5,550,396 A | 8/1996 | Tsutsumi et al. | |
| 5,687,112 A | 11/1997 | Ovshinsky | |
| 5,688,713 A | 11/1997 | Linliu et al. | |
| 5,716,883 A | 2/1998 | Tseng et al. | |
| 5,754,472 A | 5/1998 | Sim et al. | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,933,365 A | 8/1999 | Klersy et al. | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan | |
| 6,025,220 A | 2/2000 | Sandhu | |
| 6,031,287 A | 2/2000 | Harshfield | |
| 6,034,882 A | 3/2000 | Johnson et al. | |
| 6,046,951 A | 4/2000 | El Hajji et al. | |
| 6,066,870 A | 5/2000 | Siek | |
| 6,075,719 A | 6/2000 | Lowrey et al. | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,291,137 B1 | 9/2001 | Lyons et al. | |
| 6,314,014 B1 | 11/2001 | Lowrey et al. | |
| 6,316,348 B1 | 11/2001 | Fu et al. | |
| 6,320,786 B1 | 11/2001 | Chang et al. | |
| 6,326,307 B1 | 12/2001 | Lindley et al. | |
| 6,337,266 B1 | 1/2002 | Zahorik | |
| 6,339,544 B1 | 1/2002 | Chiang et al. | |
| 6,351,406 B1 | 2/2002 | Johnson et al. | |
| 6,372,651 B1 | 4/2002 | Yang et al. | |
| 6,380,068 B2 | 4/2002 | Jeng et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,440,837 B1 | 8/2002 | Harshfield | |
| 6,462,353 B1 | 10/2002 | Gilgen | |
| 6,483,736 B2 | 11/2002 | Johnson et al. | |
| 6,487,106 B1 | 11/2002 | Kozicki | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,512,263 B1 | 1/2003 | Yuan et al. | |
| 6,514,788 B2 | 2/2003 | Quinn | |
| 6,514,820 B2 | 2/2003 | Ahn et al. | |
| 6,534,781 B2 | 3/2003 | Dennison | |
| 6,545,903 B1 | 4/2003 | Wu | |
| 6,551,866 B1 | 4/2003 | Maeda et al. | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,576,546 B2 | 6/2003 | Gilbert et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,596,589 B2 | 7/2003 | Tseng et al. | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,674,115 B2 | 1/2004 | Hudgens et al. | |
| 6,677,678 B2 | 1/2004 | Biolsi et al. | |
| 6,744,088 B1 | 6/2004 | Dennison | |
| 6,750,079 B2 | 6/2004 | Lowrey et al. | |
| 6,750,101 B2 | 6/2004 | Lung et al. | |
| 6,791,102 B2 | 9/2004 | Johnson et al. | |
| 6,797,979 B2 | 9/2004 | Chiang et al. | |
| 6,800,504 B2 | 10/2004 | Li et al. | |
| 6,800,563 B2 | 10/2004 | Xu | |
| 6,809,401 B2 | 10/2004 | Nishihara et al. | |
| 6,815,704 B1 | 11/2004 | Chen | |
| 6,838,692 B1 | 1/2005 | Lung et al. | |
| 6,850,432 B2 | 2/2005 | Lu et al. | |
| 6,859,389 B2 | 2/2005 | Idehara | |
| 6,861,267 B2 | 3/2005 | Xu et al. | |
| 6,864,500 B2 | 3/2005 | Gilton | |
| 6,864,503 B2 | 3/2005 | Lung | |
| 6,867,638 B2 | 3/2005 | Saiki et al. | |
| 6,881,603 B2 | 4/2005 | Lai | |
| 6,888,750 B2 | 5/2005 | Walker et al. | |
| 6,894,304 B2 | 5/2005 | Moore | |
| 6,894,305 B2 | 5/2005 | Yi et al. | |
| 6,900,517 B2 | 5/2005 | Tanaka et al. | |
| 6,903,362 B2 | 6/2005 | Wyeth et al. | |
| 6,909,107 B2 | 6/2005 | Rodgers et al. | |
| 6,910,907 B2 | 6/2005 | Layadi et al. | |
| 6,927,410 B2 | 8/2005 | Chen | |
| 6,927,411 B2 * | 8/2005 | Kozicki | 257/4 |
| 6,928,022 B2 | 8/2005 | Cho et al. | |
| 6,933,516 B2 | 8/2005 | Xu | |
| 6,936,544 B2 | 8/2005 | Huang et al. | |
| 6,936,840 B2 | 8/2005 | Sun et al. | |
| 6,937,507 B2 | 8/2005 | Chen | |
| 6,943,365 B2 | 9/2005 | Lowrey et al. | |
| 6,969,866 B1 | 11/2005 | Lowrey et al. | |
| 6,972,428 B2 | 12/2005 | Maimon | |
| 6,972,430 B2 | 12/2005 | Casagrande et al. | |
| 6,977,181 B1 | 12/2005 | Raberg et al. | |
| 6,992,932 B2 | 1/2006 | Cohen | |
| 7,023,008 B1 | 4/2006 | Happ | |
| 7,023,009 B2 | 4/2006 | Kostylev et al. | |
| 7,033,856 B2 | 4/2006 | Lung et al. | |
| 7,038,230 B2 | 5/2006 | Chen et al. | |
| 7,038,938 B2 | 5/2006 | Kang et al. | |
| 7,042,001 B2 | 5/2006 | Kim et al. | |
| 7,042,760 B2 | 5/2006 | Hwang et al. | |
| 7,054,183 B2 | 5/2006 | Rinerson et al. | |
| 7,067,837 B2 | 6/2006 | Hwang et al. | |
| 7,067,864 B2 | 6/2006 | Nishida et al. | |
| 7,067,865 B2 | 6/2006 | Lung et al. | |
| 7,078,273 B2 | 7/2006 | Matsuoka et al. | |
| 7,099,180 B1 | 8/2006 | Dodge et al. | |
| 7,115,927 B2 | 10/2006 | Hideki et al. | |
| 7,122,281 B2 | 10/2006 | Pierrat | |

(56) References Cited

U.S. PATENT DOCUMENTS

| | | |
|---|---|---|
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,158,411 B2 | 1/2007 | Yeh et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung et al. |
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,269,052 B2 | 9/2007 | Segal et al. |
| 7,274,586 B2 | 9/2007 | Choi et al. |
| 7,277,317 B2 | 10/2007 | Le Phan et al. |
| 7,291,556 B2 | 11/2007 | Choi et al. |
| 7,309,630 B2 | 12/2007 | Fan et al. |
| 7,314,776 B2 | 1/2008 | Johnson et al. |
| 7,317,201 B2 | 1/2008 | Gutsche et al. |
| 7,321,130 B2 | 1/2008 | Lung et al. |
| 7,323,708 B2 | 1/2008 | Lee et al. |
| 7,323,734 B2 | 1/2008 | Ha et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,355 B2 * | 4/2008 | Parkinson .......................... 257/3 |
| 7,365,385 B2 | 4/2008 | Abbott |
| 7,379,328 B2 | 5/2008 | Osada et al. |
| 7,385,235 B2 | 6/2008 | Lung et al. |
| 7,388,273 B2 | 6/2008 | Burr et al. |
| 7,394,088 B2 | 7/2008 | Lung |
| 7,397,060 B2 | 7/2008 | Lung |
| 7,400,522 B2 | 7/2008 | Toda et al. |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,473,576 B2 | 1/2009 | Lung |
| 7,479,649 B2 | 1/2009 | Lung |
| 7,485,891 B2 | 2/2009 | Hamann et al. |
| 7,502,252 B2 | 3/2009 | Fuji et al. |
| 7,507,986 B2 | 3/2009 | Lung |
| 7,514,334 B2 | 4/2009 | Chen et al. |
| 7,514,705 B2 | 4/2009 | Breitwisch et al. |
| 7,515,461 B2 | 4/2009 | Happ et al. |
| 7,569,844 B2 | 8/2009 | Lung |
| 7,863,594 B2 * | 1/2011 | Akinaga et al. .................... 257/2 |
| 7,867,804 B2 * | 1/2011 | Lee ................... 438/54 |
| 7,978,508 B2 * | 7/2011 | Czubatyj ....................... 365/163 |
| 2002/0017701 A1 | 2/2002 | Klersy et al. |
| 2002/0070457 A1 | 6/2002 | Sun et al. |
| 2002/0113273 A1 | 8/2002 | Hwang et al. |
| 2002/0168852 A1 | 11/2002 | Harshfield et al. |
| 2003/0002331 A1 * | 1/2003 | Park et al. ..................... 365/163 |
| 2003/0072195 A1 | 4/2003 | Mikolajick |
| 2003/0095426 A1 | 5/2003 | Hush et al. |
| 2003/0116794 A1 | 6/2003 | Lowrey |
| 2003/0186481 A1 | 10/2003 | Lung |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127349 A1 | 6/2005 | Horak et al. |
| 2005/0141261 A1 | 6/2005 | Ahn |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0018156 A1 | 1/2006 | Happ |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157680 A1 | 7/2006 | Takaura et al. |
| 2006/0157681 A1 | 7/2006 | Chen et al. |
| 2006/0163554 A1 | 7/2006 | Lankhorst et al. |
| 2006/0169968 A1 | 8/2006 | Happ |
| 2006/0172067 A1 | 8/2006 | Ovshinsky et al. |
| 2006/0175599 A1 | 8/2006 | Happ |
| 2006/0192193 A1 | 8/2006 | Lee et al. |
| 2006/0198183 A1 | 9/2006 | Kawahara et al. |
| 2006/0202245 A1 | 9/2006 | Zuliani et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0231169 A1 | 10/2006 | Park et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1 | 12/2006 | Dodge |
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0040159 A1 | 2/2007 | Wang |
| 2007/0047296 A1 | 3/2007 | Philipp et al. |
| 2007/0051936 A1 | 3/2007 | Pellizzer et al. |
| 2007/0096162 A1 | 5/2007 | Happ et al. |
| 2007/0096248 A1 | 5/2007 | Philipp et al. |
| 2007/0097739 A1 | 5/2007 | Happ et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |

(56) References Cited

U.S. PATENT DOCUMENTS

| | | |
|---|---|---|
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0189065 A1 | 8/2007 | Suh et al. |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0048167 A1* | 2/2008 | Kostylev et al. ............... 257/2 |
| 2008/0094871 A1 | 4/2008 | Parkinson |
| 2008/0101110 A1 | 5/2008 | Happ et al. |
| 2008/0137400 A1 | 6/2008 | Chen et al. |
| 2008/0138929 A1 | 6/2008 | Lung |
| 2008/0138930 A1 | 6/2008 | Lung |
| 2008/0138931 A1 | 6/2008 | Lung |
| 2008/0151613 A1 | 6/2008 | Chao et al. |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Breitwisch et al. |
| 2008/0303014 A1 | 12/2008 | Goux et al. |
| 2009/0001341 A1 | 1/2009 | Breitwisch et al. |
| 2009/0008636 A1* | 1/2009 | Lee ............................ 257/42 |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0072215 A1 | 3/2009 | Lung et al. |
| 2009/0098678 A1 | 4/2009 | Lung |
| 2009/0166603 A1 | 7/2009 | Lung |
| 2009/0226603 A1* | 9/2009 | Lowrey ..................... 427/58 |
| 2009/0250678 A1* | 10/2009 | Osano et al. ................ 257/2 |
| 2009/0268507 A1 | 10/2009 | Breitwisch et al. |
| 2009/0289242 A1 | 11/2009 | Breitwisch et al. |
| 2009/0294748 A1 | 12/2009 | Breitwisch et al. |
| 2010/0038614 A1* | 2/2010 | Hampton ..................... 257/2 |
| 2010/0244023 A1* | 9/2010 | Parkinnson ................. 257/48 |
| 2011/0234362 A1* | 9/2011 | Koehler et al. ............. 337/290 |
| 2012/0225504 A1* | 9/2012 | Hong et al. ................. 438/17 |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, published in 1997, pp. 1-6.

Bedeschi, F. et al., "4-MB MOSFET-Selected Phase-Change Memory Experimental Chip," IEEE, 2004, 4 PP.

Blake thesis, "Investigation of GeTeSb5 Chalcogenide Films for Use as an Analog Memory," AFIT/GG/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell for Phase Change RAM Featuring Very Low Power Consumption," 2003 Symposium on VLSI Technology Digest of Technical Papers, pp. 175-176.

Hanzawa, Satoru, et al., "A 512kB Embedded Phase Change Memory with 416kB/s Write Throughput at 100 µA Cell Write Current," ISSCC 2007, Session 26, Non-Volatile Memories/26.2, 3 pages.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

(56) References Cited

OTHER PUBLICATIONS

Hegedus, J., "Microscopic origin of the fast crystallization ability of Ge—Sb—Te phase-change memory materials," Dept. of Chemistry, University of Cambridge, published online Mar. 23, 2008, 7 pages.
Horii, H. et al., "A Novel Cell Technology Using N-doped GeSbTe Films for Phase Change RAM," 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.
Kim, Kinam et al., "Reliability Investigations for Manufacturable High Density PRAM," IEEE 43rd Annual International Reliability Physics Symposium, San Jose, 2005, pp. 157-162.
Kojima, Rie et al., "Ge—Sn—Sb—Te Phase-change Recording Material Having High Crystallization Speed," Proceedings of PCOS 2000, pp. 36-41.
Lacita, A. L., "Electrothermal and Phase-change Dynamics in Chalcogenide-based Memories," IEEE IEDM 2004, 4 pp.
Lai, Stefan, "Current Status of the Phase Change Memory and Its Future," IEEE IEDM 2003, pp. 255-258.
Lai, Stephan et al., "OUM-A 180 nm Nonvolatile Memory Cell Element Technology for Stand Alone and Embedded Applications," IEEE IEDM 2001, pp. 803-806.
Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.
Li, Yiming, "Temperature dependence on the contact size of GeSbTe films for phase change memories," J. Comput Electron (2008) 7:138-141.
Lung, Hsiang-Lan, et al., "Dielectric Mesh Isolated Phase Change Structure for Phase Change Memory," U.S. Appl. No. 12/286,874, filed Oct. 2, 2008, 50 pages.
Mott, Nevill, "Electrons in Glass," Nobel Lecture, Dec. 8, 1977, Physics, 1977, pp. 403-413.
Oh, Hyung-Rok, et al., "Enhanced Write Performance of a 64Mb Phase-Change Random Access Memory," ISSCC 2005, Session 2, Non-Volatile Memory, 2.3, 3 pages.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Pellizer, F. et al.,"Novel u Trench Phase-Change Memory Cell for Embedded and Stand-Alone Non-Volatile Memory Applications," 2004 Symposium on VLSI Technology Digest of Technical Papers, pp. 18-19.
Pirovano, Agostino et al.,"Reliability Study of Phase-Change Nonvolatile Memories," IEEE Transactions on Device and Materials Reliability, Sep. 2004, pp. 422-427, vol. 4, No. 3.
Prakash, S. et al., "A guideline for Designing Chalcogenide-Based Glasses for Threshold Switching Characteristics," IEEE Electron Device Letters, vol. 18, No. 2, Feb. 1997, pp. 45-47.
Radaelli, A. et al., "Electronic Switching Effect and Phase-Change Transition in Chalcogenide Materials," IEEE Electron Device Letters, Oct. 2004, pp. 684-686, vol. 25, No. 10.
Rochefort, C. et al., "Manufacturing of High Aspect-Ration p-n Junctions Using Vapor Phase Doping for Application in Multi-Resurf Devices," IEEE 2002, pp. 237-240.
Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.
Strauss, Karl F. et al., "Overview of Radiation Tolerant Unlimited Write Cycle Non-Volatile Memory," IEEE 2000, pp. 399-408.
Subramanian, Vivek et al., "Low Leakage Germanium-Seeded Laterally-Crystallized Single-Grain 100-nm TFTs for Vertical Integration Applications," IEEE Electron Device Letters, vol. 20, No. 7, Jul. 1999, pp. 341-343.
Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.
Wicker, Guy, "A Comprehensive Model of Submicron Chalcogenide Switching Devices," Doctoral Dissertation, Wayne State University, Detroit, MI 1996, 137 pp.
Wolf, Stanley, Excerpt from: Silicon Processing for the VLSI Era—vol. 4, pp. 674-679, 2004.
Wuttig, Matthias, "Towards a Universal Memory?" Nature Materials, Apr. 2005, pp. 265-266, vol. 4.
Yamada, Noboru, "Potential of Ge—Sb—Te phase-change optical disks for high-data-rate recording in the near future," (Conference Proceedings Paper), Jul. 30, 1997, vol. 3109, 10 pages.
Yi, J. H. et al., "Novel Cell Structure of PRAM with Thin Metal Layer Inserted GeSbTe," IEEE IEDM 2003, 4 pages.
Yonehara, T. et al., "Control of Grain Boundary Location by Selective Nucleation Over Amorphous Substrates," Mat. Res. Soc. Symp. Proc., vol. 106, 1998, pp. 21-26.

\* cited by examiner

PHASE CHANGE MEMORY HAVING STABILIZED MICROSTRUCTURE AND MANUFACTURING METHOD

PARTIES TO A JOINT RESEARCH AGREEMENT

International Business Machines Corporation, a New York corporation, and Macronix International Corporation, Ltd., a Taiwan corporation, are parties to a Joint Research Agreement.

BACKGROUND OF THE INVENTION

1. Field of the Invention

The present invention relates to memory devices based on chalcogenide materials, and methods for manufacturing such devices.

2. Description of Related Art

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous state.

The magnitude of the current needed for reset can be reduced by reducing the size of the phase change material element in the cell and/or the contact area between electrodes and the phase change material, such that higher current densities are achieved with small absolute current values through the phase change material element.

Research has progressed to provide memory devices that operate with low reset current by adjusting a doping concentration in phase change material, and by providing structures with very small dimensions. One problem with very small dimension phase change devices involves endurance. Specifically, the resistance of memory cells made using phase change materials in a set state can drift as the composition of the phase change material slowly changes with time over the life of the device. Co-pending U.S. patent application entitled DIELECTRIC MESH ISOLATED PHASE CHANGE STRUCTURE FOR PHASE CHANGE MEMORY, application Ser. No. 12/286,874, filed 2 Oct. 2008, addresses some of the issues discussed above related to changes in composition of the phase change memory during the first few cycles operation. Application Ser. No. 12/286,874 is incorporated by reference as if fully set forth herein.

This drift can cause problems with reliability and increase in complexity of control circuitry needed to operate the devices. For example, if the resistance drifts on SET or/and RESET state cells, phase change speed changes, the dynamic resistance of the cells may change, different retention behaviors (resistance stability) are encountered, and so on. One result of these problems is that the sensing circuitry required on the devices must handle wider ranges of resistance for each of the memory states, which typically results in lower speed operation. Also, the set and reset processes must account for varying bulk conditions of the memory cells even within a single memory state, which typically results uneven set and reset speeds across the array.

Accordingly, it is desirable to provide a memory cell structure having more stable operation over the life of the device.

SUMMARY OF THE INVENTION

A memory device having a phase change material element with a modified stoichiometry in the active region is described, which does not exhibit the drift in set state resistance of prior art memory devices. Also, a method for manufacturing the memory device is described that includes first manufacturing an integrated circuit including an array of phase change memory cells with bodies of phase change material having a bulk stoichiometry; and then applying forming current to the phase change memory cells in the array to change the bulk stoichiometry in active regions of the bodies of phase change material to the modified stoichiometry, the modified stoichiometry being different than the bulk stoichiometry, and without disturbing the bulk stoichiometry outside the active regions. The bulk stoichiometry is characterized by stability under the thermodynamic conditions outside the active region, while the modified stoichiometry is characterized by stability under the thermodynamic conditions inside the active region. By establishing the bulk and modified stoichiometry in the memory element, the set state resistance of the memory cell is stabilized over the lifetime of the cell, which can extend to millions of set/reset cycles and more. The body of phase change material used as a memory element adopts a stabilized microstructure in which the stoichiometry is non-uniform, having a different atomic concentration profile in the active region than is found outside the active region of the body of phase change material. The transition in stoichiometry of the body of phase change material is not abrupt, but rather occurs across a transitional zone along the boundaries of the active region. The transitional zone characteristics will vary according to the structure of the memory cell, the type of forming current applied, and other factors.

The term "stoichiometry" as used here refers to the quantitative relationship in atomic concentration between two or more substances in the phase change material in a volume measurable, for example, using energy dispersive x-ray spectroscopy (EDX), or equivalent techniques.

The forming current is applied in pulses significantly longer than the set/reset pulses used during the operation of the memory device. For example, a forming current pulse can comprise a single pulse or multiple pulses, have a duration of more than 0.5 milliseconds, such as 1 millisecond or more. The forming current may have a ramped trailing edge, to prevent rapid quenching of the modification process.

In the representative embodiments, the phase change memory cells in the array have a resistance in the set state which remains stable within a range having a width less than 20 kOhms over more than 1 million set/reset cycles.

The method has been demonstrated for silicon oxide doped for $Ge_xSb_yTe_z$, with a bulk stoichiometry in which x=2, y=2 and z=5, doped with 10 to 20 atomic percent silicon oxide, and having a modified stoichiometry in which y>2 and z<5 (where x, y, and z are measured with one significant digit). The resulting device demonstrates substantial improvement in the stability of the resistance in the set state. However, the process can be extended to other chalcogenide materials, including materials having dielectric and active doping components.

A manufacturing process described herein includes providing circuitry on the integrated circuit to apply set and reset pulses to the memory cells for writing data, and in addition to apply forming current in the active regions of the memory cells to induce the change to the modified stoichiometry within the active region.

The memory device described herein comprises an integrated circuit including an array of phase change memory cells. A memory cell in the array includes a body of phase change material having a bulk stoichiometry outside its active region, and having a modified stoichiometry inside its active region. Although this condition of the memory cell can occur in prior art cells after many set/reset cycles, the integrated circuit described herein includes circuitry having a both a programming mode to apply set and reset pulses to the array of phase change memory cells, and a forming mode to apply forming current to the array of phase change memory cells to change the bulk stoichiometry in the active regions in the bodies of phase change material to the modified stoichiometry.

Other features, combinations of features, aspects and advantages of the technology described herein can be seen in the drawings, the detailed description and the claims, which follow.

DETAILED DESCRIPTION

A detailed description of embodiments of the present invention is provided with reference to FIGS. 1-28.

Figure 1:
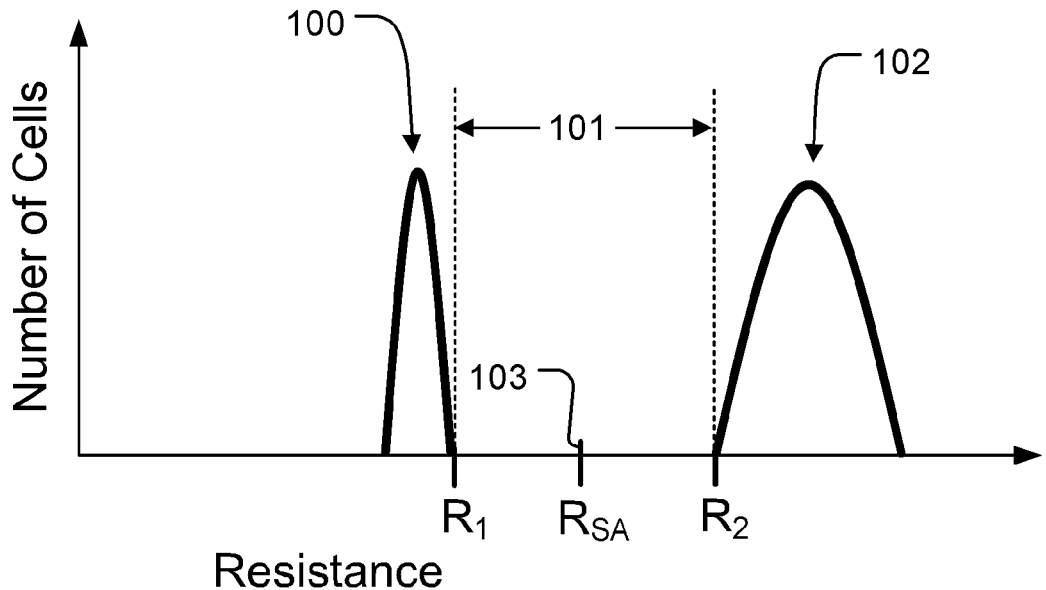
FIG. 1 is a graph showing resistance distributions for memory states in phase change memory cells.

In phase change memory, data is stored by causing transitions in an active region of the phase change material between amorphous and crystalline phases, which have significantly different resistances. FIG. 1 is a graph of resistance distributions for memory states in memory cells storing a single bit of data, including a low resistance set (programmed) state 100 corresponding to a primarily crystalline phase in the active region of the cell, and a high resistance reset (erased) state 102 corresponding to a primarily amorphous phase in the active region of the cell. For reliable operation, the resistance distributions must have non-overlapping resistance ranges.

The difference between the highest resistance $R_1$ of the set state 100 and the lowest resistance $R_2$ of the reset state 102 defines a read margin 101 used to distinguish cells in the set state 100 from those in the reset state 102. The data stored in a memory cell can be determined by measuring whether the resistance of the memory cell is above or below a threshold resistance value $R_{SA}$ 103 within the read margin 101. In multiple bit per cell embodiments, there are more than two resistance states with read margins between them.

In order to reliably distinguish between the reset state 102 and the set state 100, it is important to maintain a relatively large read margin 101. Sensing circuitry on the cell is designed to operate within the read margins defined, and more narrow margins require more complex circuitry and can result in slower read processes. Also, set and reset pulses are designed based on the resistance distributions within the set and reset states. Wider distributions of resistance with the set state for example result in variations in the amount of time, or in the amount of power needed to cause a phase transition to the amorphous state, and vice versa.

Figure 2:
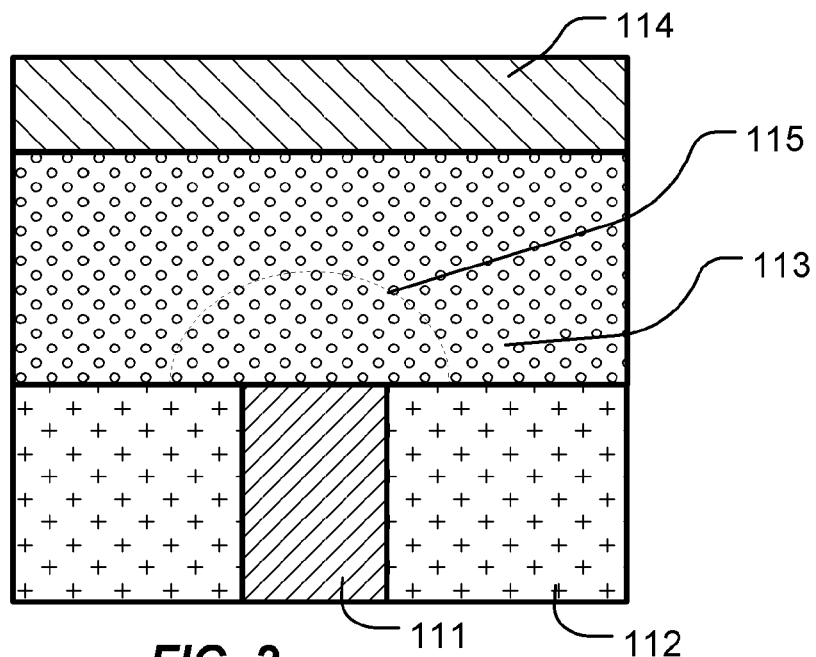
FIG. 2 shows basic structure of a phase change memory cell.

FIG. 2 illustrates a prior art "mushroom type" memory cell 110 having a first electrode 111 extending through dielectric 112, a memory element 113 comprising a body of phase change material, and a second electrode 114 on the memory element 113. The first electrode 111 is coupled to a terminal of an access device (not shown) such as a diode or transistor, while the second electrode 114 is coupled to a bit line and can be part of the bit line (now shown). The first electrode 111 has a width less than the width of the second electrode 114 and memory element 113, establishing a small contact area between the body of phase change material and the first electrode 111 and a relatively larger contact area between the body of phase change material and the second electrode 114, so that higher current densities are achieved with small absolute current values through the memory element 113. Because of this smaller contact area at the first electrode 111, the current density is largest in operation in the region adjacent the first electrode 111, resulting in the active region 115 having a "mushroom" shape as shown in the Figure. In the memory cell illustrated, the bulk stoichiometry of the body of phase change material is uniform inside and outside the active region 115.

Figure 3:
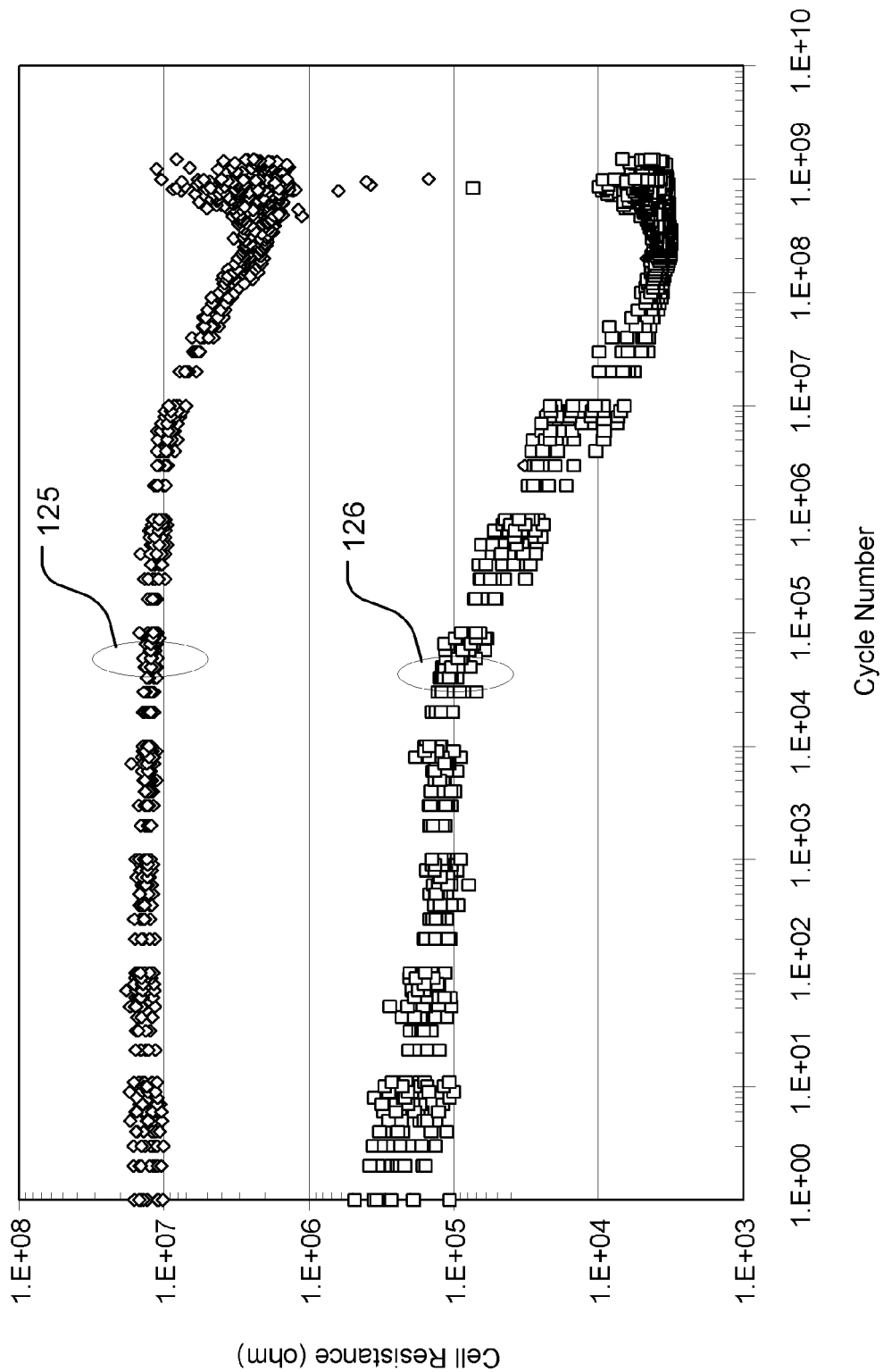
FIG. 3 is a plot of set and reset state resistance of a prior art memory cell versus set/reset cycle number.

FIG. 3 is a log scale plot of the reset resistance ("diamond" samples 125) and set resistance ("square" samples 126) over set/reset cycle number for a cell starting with a uniform bulk stoichiometry as illustrated in FIG. 2 in the cell having a bottom electrode with a diameter of about 50 nanometers coupled to a body of phase change material about 90 nanometers thick. The plot shows that the set resistance drifts downward over $1 \times 10^6$ cycles by more than an order of magnitude, and continues to drift downward up to about $1 \times 10^8$ cycles, and thereafter the cell fails. As the plot is log scale resistance and cycle number, the drift downward in the reset resistance is not readily compared in this graph to that of the set resistance up to about $1 \times 10^6$ cycles. However, the resistance of the reset state suffers a decline of similar or greater magnitude as that of the set state up to about $1 \times 10^6$ cycles. Thereafter the decline in reset resistance is clearly shown in the graph until the device fails. In this example, the reset pulse was applied using a 3.5 volt supply potential, while applying a gate voltage to an MOS access transistor for the cell with the peak voltage of 3 volts, having a 19 nanosecond rising edge, a 40 nanosecond level section, and a 2 nanosecond falling edge. In this example, the step pulse was applied using a 3.5 volt supply potential, while applying a gate voltage to the MOS access transistor for the cell with a peak voltage of 1.6 volts, having a 100 nanosecond rising edge, a 300 nanosecond level section, and a 1990 nanosecond trailing edge.

Figure 4:
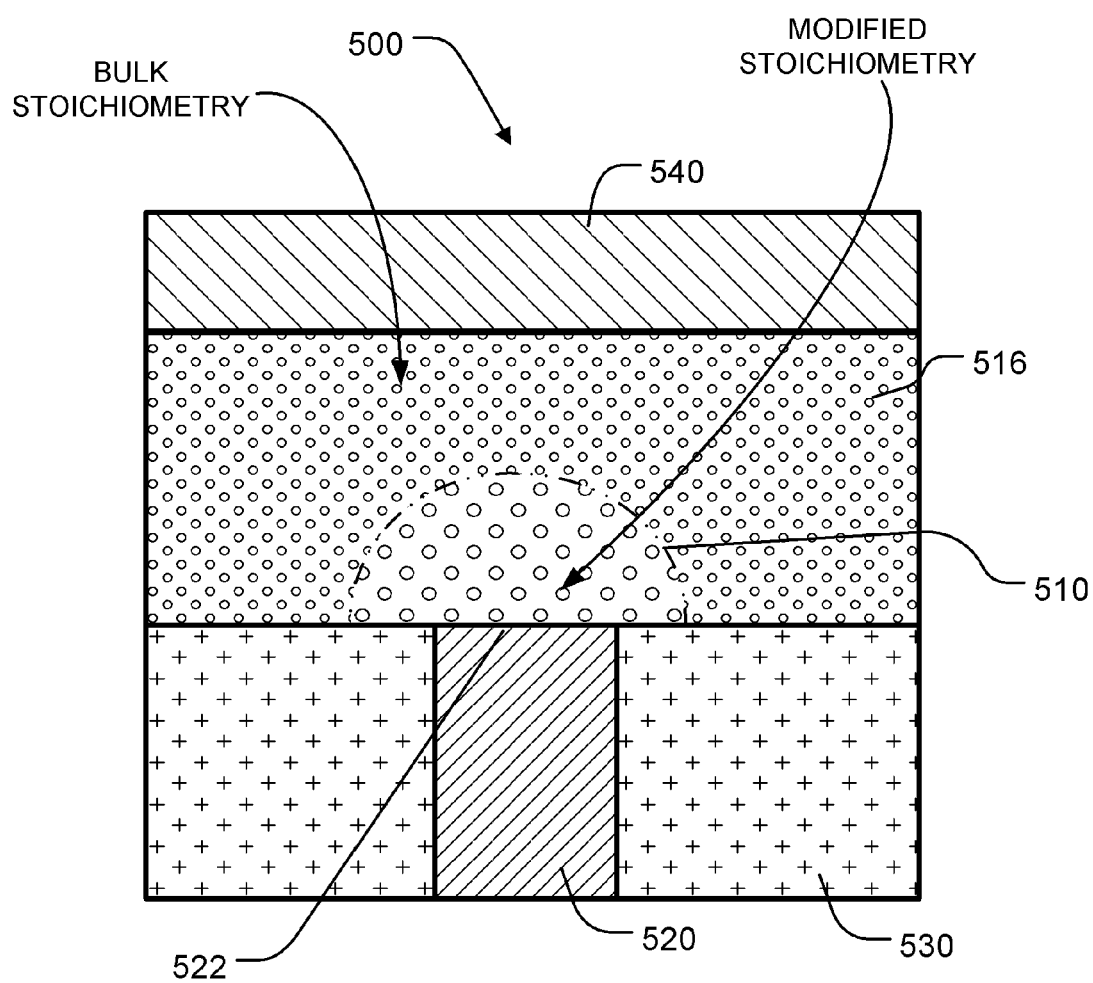
FIG. 4 illustrates structure of a memory cell with a body of phase change material having a bulk stoichiometry outside the active region and a modified stoichiometry inside the active region.

FIG. 4 illustrates a memory cell 500 includes a first electrode 520 extending through dielectric 530 to contact a bottom surface of the memory element 516, and a second electrode 540 on the memory element 516 consisting of a body of phase change material. The body of phase change material in the memory element 516 has a bulk stoichiometry outside the active region 510 and a modified stoichiometry inside the active region, where the modified stoichiometry is different than the bulk stoichiometry.

The first and second electrodes 520, 540 may comprise, for example, TiN or TaN. Alternatively, the first and second electrodes 520, 540 may each be W, WN, TiAlN or TaAlN, or comprise, for further examples, one or more elements selected from the group consisting of doped-Si, Si, C, Ge, Cr, Ti, W, Mo, Al, Ta, Cu, Pt, Ir, La, Ni, N, O, and Ru and combinations thereof.

In the illustrated embodiment the dielectric 530 comprises SiN. Alternatively, other dielectric materials, such as silicon oxides, may be used.

The phase change material of memory element 516 in this example comprises $Ge_xSb_yTe_z$ material doped with 10 to 20 atomic percent (at %) silicon oxide, wherein for the bulk stoichiometry x=2, y=2 and z=5. For the modified stoichiometry in the active region, x=2, y=4 and z=4, within rounding error for one significant bit, for this example cell.

Other chalcogenides and phase change alloy materials may be used as well. As can be seen in the Figures the contact surface 522 between the first electrode 520 and the body of phase change material has a width (which in some embodiments is a diameter) less than that of the memory element 516 and top electrode 540. Thus current is concentrated in the portion of the memory element 516 adjacent the first electrode 520, resulting in the active region 510 as shown, in which the phase change kinetics are confined during operation. The memory element 516 also includes an inactive region outside the active region 510. Using this material, the inactive region remains in a polycrystalline state with small grain size.

The active region 510 comprises phase change material domains within a dielectric-rich mesh (not shown), caused by separation of the silicon oxide doping from the phase change alloy, as described in detail in U.S. patent application entitled DIELECTRIC MESH ISOLATED PHASE CHANGE STRUCTURE FOR PHASE CHANGE MEMORY, application Ser. No. 12/286,874, referred to above.

Figure 5:
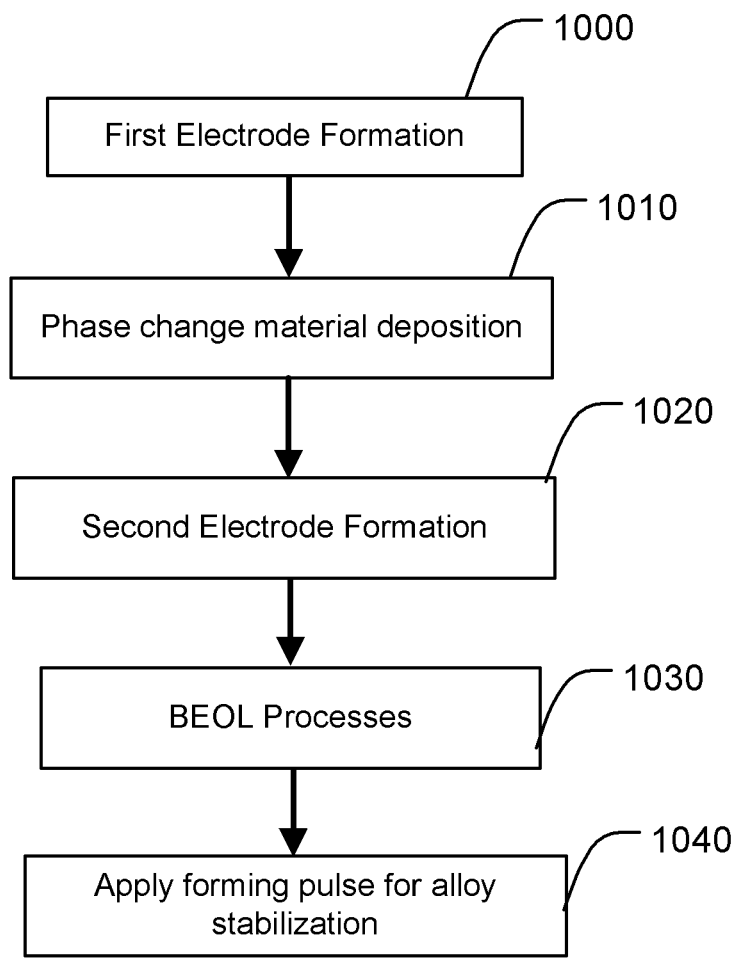
FIG. 5 is a simplified flowchart of a manufacturing process described herein.

FIG. 5 illustrates a process flow diagram of a manufacturing process for manufacturing a memory cell comprising a body of phase change material, with a bulk stoichiometry and a modified stoichiometry within the active region as shown in FIG. 4.

At step 1000 the first electrode 520 having a contact surface 522 is formed, extending through dielectric 530. In the illustrated embodiment the first electrode 520 comprises TiN and the dielectric 530 comprises SiN. In some embodiments the contact surface 522 of the first electrode 520 has a sublithographic width or diameter.

The first electrode 520 extends through dielectric 530 to underlying access circuitry (not shown). The underlying access circuitry can be formed by standard processes as known in the art, and the configuration of elements of the access circuitry depends upon the array configuration in which the memory cells described herein are implemented. Generally, the access circuitry may include access devices such as transistors and diodes, word lines and sources lines, conductive plugs, and doped regions within a semiconductor substrate.

The first electrode 520 and the dielectric 530 can be formed, for example, using methods, materials, and processes as disclosed in U.S. patent application Ser. No. 11/764,678 filed on 18 Jun. 2007, now Publication No. US2008-0191187 published on 14 Aug. 2008, entitled "Method for Manufacturing a Phase Change Memory Device with Pillar Bottom Electrode", which is incorporated by reference herein. For example, a layer of electrode material can be formed on the top surface of access circuitry (not shown), followed by patterning of a layer of photoresist on the electrode layer using standard photolithographic techniques so as to form a mask of photoresist overlying the location of the first electrode 520. Next the mask of photoresist is trimmed using, for example, oxygen plasma to form a mask structure having sublithographic dimensions overlying the location of the first electrode 520. Then the layer of electrode material is etched using the trimmed mask of photoresist, thereby forming the first electrode 520 having a sublithographic diameter. Next dielectric 530 is formed and planarized.

As another example, the first electrode 520 and dielectric 530 can be formed using methods, materials, and processes as disclosed in U.S. patent application Ser. No. 11/855,979 filed on 14 Sep. 2007, now Publication No. US2009-0072215 published on 19 Mar. 2009, entitled "Phase Change Memory Cell in Via Array with Self-Aligned, Self-Converged Bottom Electrode and Method for Manufacturing", which is incorporated by reference herein. For example, the dielectric 530 can be formed on the top surface of access circuitry followed by sequentially forming an isolation layer and a sacrificial layer. Next, a mask, having openings close to or equal to the minimum feature size of the process used to create the mask, is formed on the sacrificial layer, the openings overlying the location of the first electrode 520. The isolation layer and the sacrificial layers are then selectively etched using the mask, thereby forming a via in the isolation and sacrificial layers and exposing a top surface of the dielectric 530. After removal of the mask, a selective undercutting etch is performed on the via such that the isolation layer is etched while leaving the sacrificial layer and the dielectric 530 intact. A fill material is then formed in the via, which due to the selective undercutting etch process results in a self-aligned void in the fill material being formed within the via. Next, an anisotropic etching process is performed on the fill material to open the void, and etching continues until the dielectric 530 is exposed in the region below the void, thereby forming a sidewall spacer comprising fill material within the via. The sidewall spacer has an opening dimension substantially determined by the dimensions of the void, and thus can be less than the minimum feature size of a lithographic process. Next, the dielectric 530 is etched using the sidewall spacers as an etch mask, thereby forming an opening in the dielectric 530 having a diameter less than the minimum feature size. Next, an electrode layer is formed within the openings in the dielectric 530. A planarizing process, such as chemical mechanical polishing CMP, is then performed to remove the isolation layer and the sacrificial layer and to form the first electrode 520.

At step 1010, a body of phase change material having a bulk stoichiometry (e.g. doped $Ge_2Sb_2Te_5$ material having 10 to 20 at % silicon oxide) is deposited on the first electrode 520 and dielectric 530. The deposition of $Ge_2Sb_2Te_5$ and silicon oxide may be carried out by co-sputtering of a GST target with for one example, a DC power of 10 Watts and an $SiO_2$ target with an RF power of 10 to 115 Watts in an argon atmosphere. Other processes may be used as suits a particular phase change material and memory cell structure.

An optional annealing (not shown) can be performed to crystallize the phase change material. In the illustrated embodiment the thermal annealing step is carried out at 300° C. for 100 seconds in a nitrogen ambient. Alternatively, since subsequent back-end-of-line processes performed to complete the device may include high temperature cycles and/or a thermal annealing step depending upon the manufacturing techniques used to complete the device, in some embodiments the annealing may accomplished by following processes, and no separate annealing step is added to the manufacturing line.

Next, at step 1020 a second electrode 540 is formed, resulting in the structure illustrated in FIG. 4. In the illustrated embodiment the second electrode 540 comprises TiN.

Figure 28:
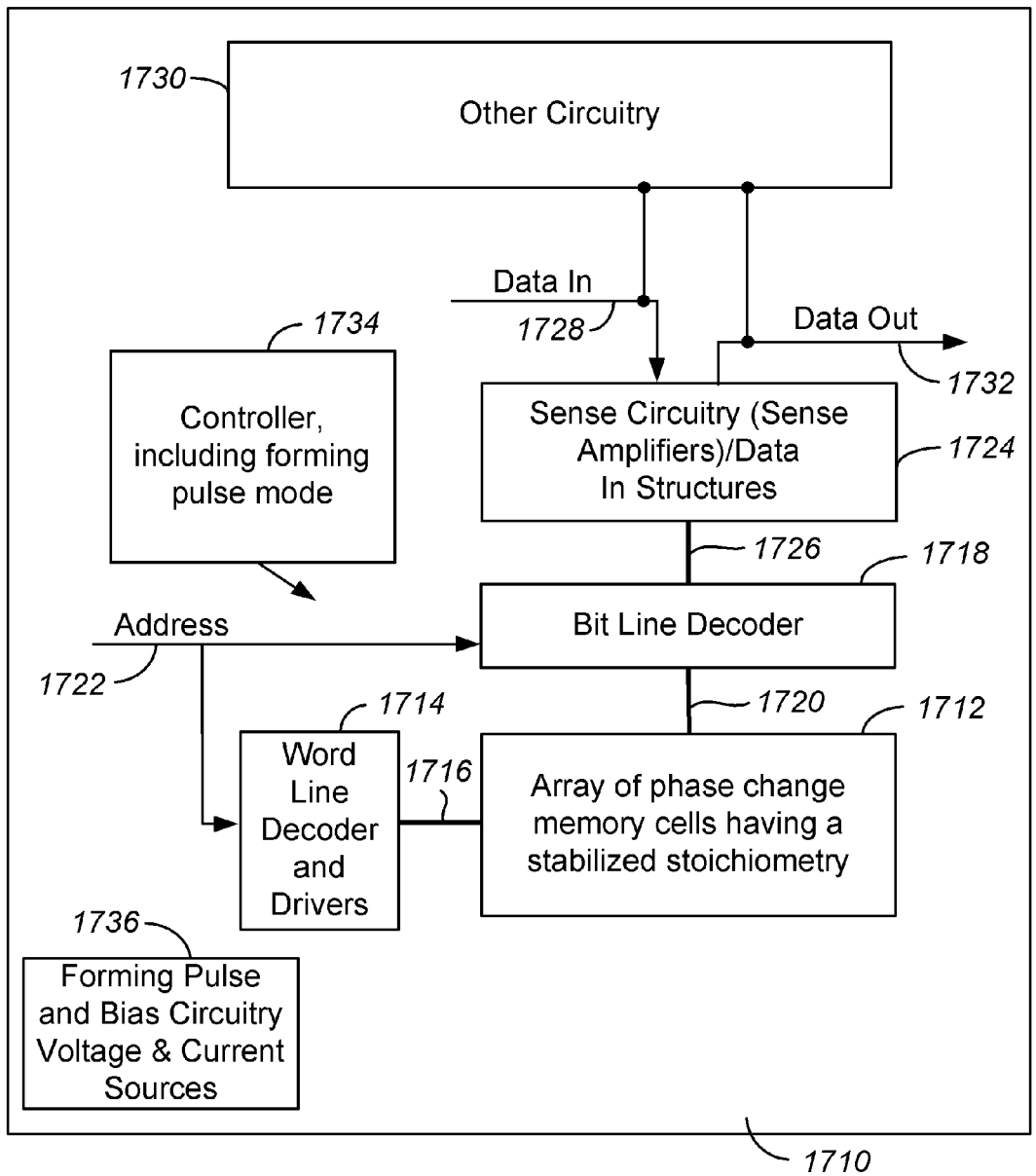
FIG. 28 is a simplified block diagram of an integrated circuit memory device including phase change memory cells as described herein.

Next, at step 1030 back-end-of-line (BEOL) processing is performed to complete the semiconductor process steps of the chip. The BEOL processes can be standard processes as known in the art, and the processes performed depend upon the configuration of the chip in which the memory cell is implemented. Generally, the structures formed by BEOL processes may include contacts, inter-layer dielectrics and various metal layers for interconnections on the chip including circuitry to couple the memory cell to peripheral circuitry. These BEOL processes may include deposition of dielectric material at elevated temperatures, such as depositing SiN at 400° C. or high density plasma HDP oxide deposition at temperatures of 500° C. or greater. As a result of these processes, control circuits and biasing circuits as shown in FIG. 28 are formed on the device, including in some embodiments circuitry for applying forming current as described below.

Next, at step 1040 a forming current is applied to the memory cells in the array to melt the active region for a duration sufficient to result in formation of the modified stoichiometry in the active region of the memory cell 500. The forming current can be applied using on-chip control circuits and bias circuits to melt and cool the active regions at least once, or enough times, to cause formation of the modified stoichiometry. Thus, the control circuits and bias circuits may be implemented to execute a forming mode, using voltage levels and pulse lengths that differ from the normal set/reset cycling used during device operation. In yet another alternative, the melting/cooling cycling may be executed using equipment in the manufacturing line that connects to the chips during manufacture, such as test equipment, to set voltage magnitudes and pulse heights.

The forming current is applied to the cell, resulting in a non-uniform current which creates a temperature profile, which can differ by several hundred degrees Celsius in the active region within less than a 100 nm radius. For example, during a forming pulse, the temperature in the body of phase change material may be more than 600° C. near the bottom electrode, and less than 150° C. outside the active region. That is a very large temperature gradient in such a small volume and generates a large internal stress. As a result, the atoms in the phase change material tend to rearrange to the most stable (lowest energy) structure and composition profile, which fits the temperature gradient. The stoichiometry in the active region changes to form the stable structure, while the bulk stoichiometry outside the active region remains essentially unchanged. After the structure/composition profile is formed, the stress from the temperature gradient can be relaxed. This results in a more stable cell over the life of the device, as described in more detail below. It is believed that at higher temperature, the $Ge_xSb_yTe_z$ material prefers higher Sb composition and less Ge. So the Sb atoms move to the high temperature, active region (i.e., close to the bottom electrode in the active region) after the forming pulse, resulting in lowering of the SET resistance and a measurable change in stoichiometry.

FIGS. 6-14 illustrate a variety of pulse shapes for forming current which can be applied to cause the modified stoichiometry in the active region of the body of phase change material for the cell.

Figure 6:
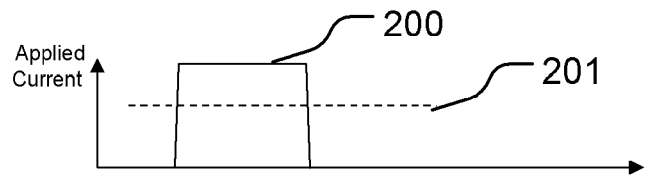
FIGS. 6-14 illustrate alternative pulse shapes for forming current used in the manufacturing process described in FIG. 5.

In FIG. 6, a single square pulse 200 of relatively long duration and rapid rising and falling edges is applied, with an amplitude above the melting threshold 201 for the phase change material to cause a cumulative duration in the high temperature phase sufficient for formation of the modified stoichiometry in the active region. Representative pulse widths can range from about 0.5 millisecond to over 200 milliseconds, depending upon the materials used, the configuration of the memory cell, the number of memory cells in the array, the specified life of the cell in number of set/reset cycles, and other factors.

Figure 7:
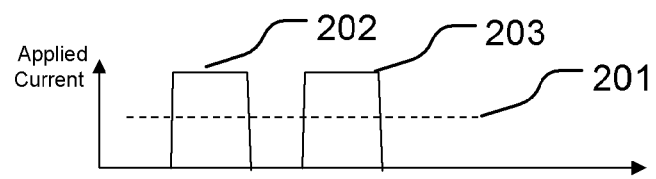

FIG. 7 shows that the forming current can be applied as a sequence of square pulses 202, 203 which cause a cumulative duration in the high temperature phase sufficient for formation of the modified stoichiometry in the active region.

Figure 8:
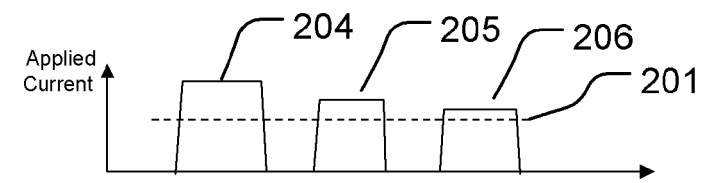

FIG. 8 shows that the forming current can be applied as a sequence of square pulses 204, 205, 206 having stepped down magnitudes, which cause a cumulative duration in the high temperature phase sufficient for formation of the modified stoichiometry in the active region. The stepped down magnitudes may prevent formation of interfacial layers and localized anomalies in the structure.

Figure 9:
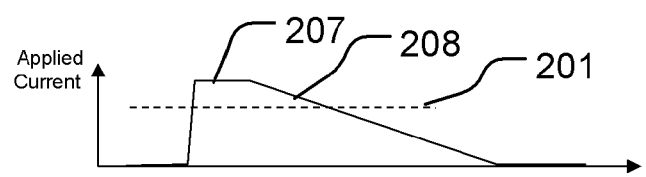

FIG. 9 shows that the forming current can be applied as a single pulse 207 with a rapid rising edge and a ramp-shaped trailing edge or tail 208 of constant or near constant slope, which causes a cumulative duration in the high temperature phase sufficient for formation of the modified stoichiometry in the active region. The tail 208 of the forming pulse can let the atoms move more gently without a sudden stop (quench), thus preventing the forming of an interface layer in the active region. For pulses having a fast trailing edge which ramps to zero in an interval shorter than a quench cutoff, the fast trailing edge could be considered as a "quench" which results in the material solidifying in the active region in the amorphous phase. This quench cutoff is about 10 nanoseconds in a phase change material based on $Ge_2Sb_2Te_5$, and will be different for different phase change materials. In the embodiment shown in FIG. 9, the trailing edge ramps for a time interval significantly greater than the quench cutoff, e.g. more that twice the quench cutoff, and can be 5 to 10 times longer, or more.

Figure 10:
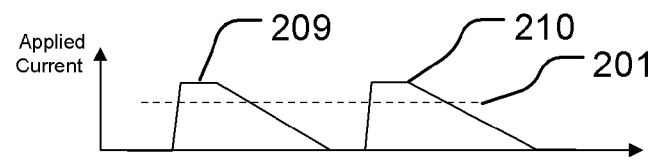

FIG. 10 shows that the forming current can be applied as a sequence of pulses 209, 210 having sloped trailing edges with relatively long tails of constant or near constant slope, which cause a cumulative duration in the high temperature phase sufficient for formation of the modified stoichiometry in the active region. For a pulse having a peak current sufficient to cause a temperature in the active region over the melting threshold for a first duration for the phase change material, the sloped trailing edge in which the current magnitude drops over a time interval significantly greater than the quench cutoff, in this example can reduce interface formation within the body of phase change materials.

Figure 11:
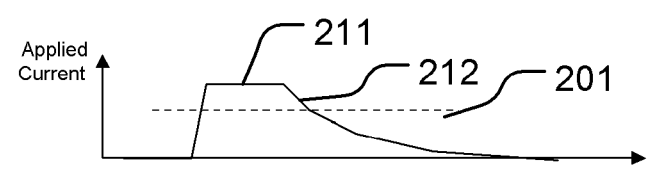

FIG. 11 shows that the forming current can be applied as a single pulse 211 with a rapid rising edge and a ramp-shaped, or sloped, trailing edge or tail 212 of changing slope, going from a relatively high negative slope to a slope close to zero over the length of the trailing edge, which causes a cumulative duration in the high temperature phase sufficient for formation of the modified stoichiometry in the active region. For a pulse having a peak current sufficient to cause a temperature in the active region over the melting threshold for a first duration for the phase change material, the sloped trailing edge in which the current magnitude drops over a time interval greater than the quench cutoff, in this example can reduce interface formation within the body of phase change materials.

Figure 12:
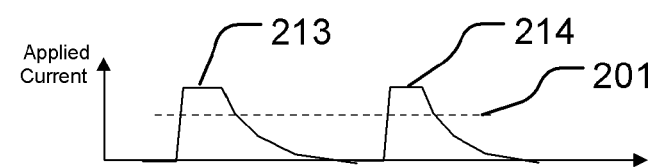

FIG. 12 shows that the forming current can be applied as a sequence of pulses 213, 214 having ramped trailing edges with relatively long tails of changing slope, which cause a cumulative duration in the high temperature phase sufficient for formation of the modified stoichiometry in the active region. Each pulse in the sequence, or only a final pulse in the sequence can be characterized by having a peak current sufficient to cause a temperature in the active region over the melting threshold for a first duration for the phase change material, and a sloped trailing edge in with the current magnitude drops over a time interval significantly greater than the quench cutoff.

Figure 13:
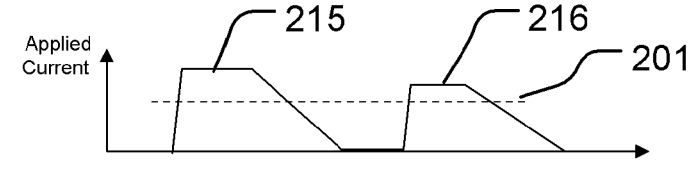

FIG. 13 shows that the forming current can be applied as a sequence of pulses 215, 216 with amplitudes stepping down, and having sloped trailing edges with relatively long tails of constant or near constant slope, which cause a cumulative duration in the high temperature phase sufficient for formation of the modified stoichiometry in the active region. Each pulse in the sequence, or only a final pulse in the sequence can be characterized by having a peak current sufficient to cause a temperature in the active region over the melting threshold for a first duration for the phase change material, and a sloped trailing edge in with the current magnitude drops over a time interval significantly greater than the quench cutoff.

Figure 14:
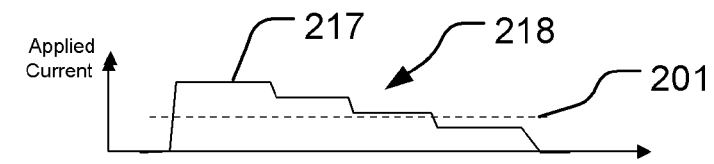

FIG. 14 shows that the forming current can be applied as a single pulse 217 with a rapid rising edge and a sloped trailing edge implemented by a stepping down trailing edge or tail 218, which causes a cumulative duration in the high temperature phase sufficient for formation of the modified stoichiometry in the active region.

FIGS. 6-14 show a variety of pulse shapes for forming current. Of course, other pulse formats and pulse sequences can be applied to achieve the result of causing formation of the modified stoichiometry in the active region.

Figure 15:
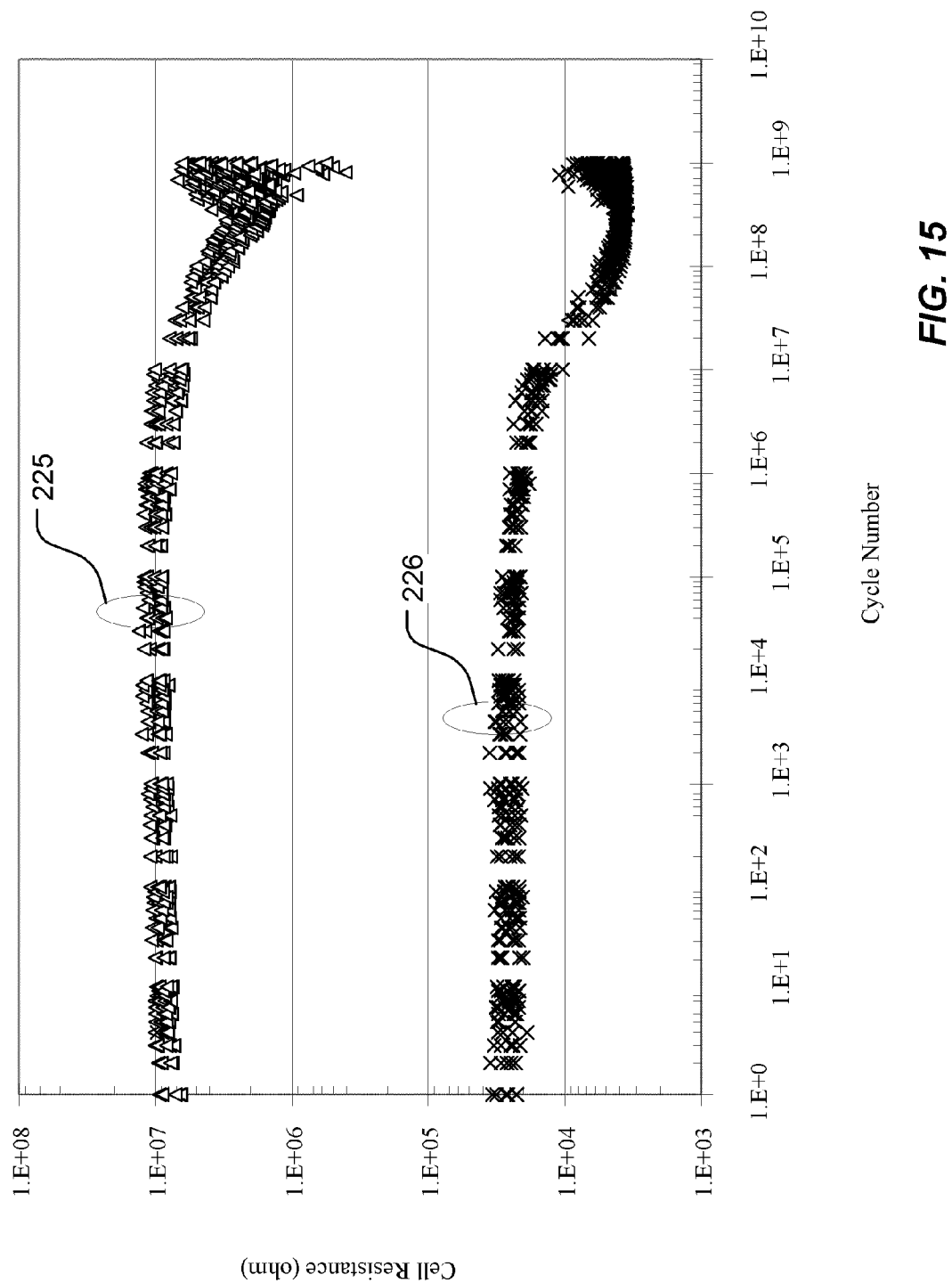
FIG. 15 is a plot of set and reset state resistance versus set/reset cycle number of a first example memory cell having a modified stoichiometry as described herein.
Figure 22:
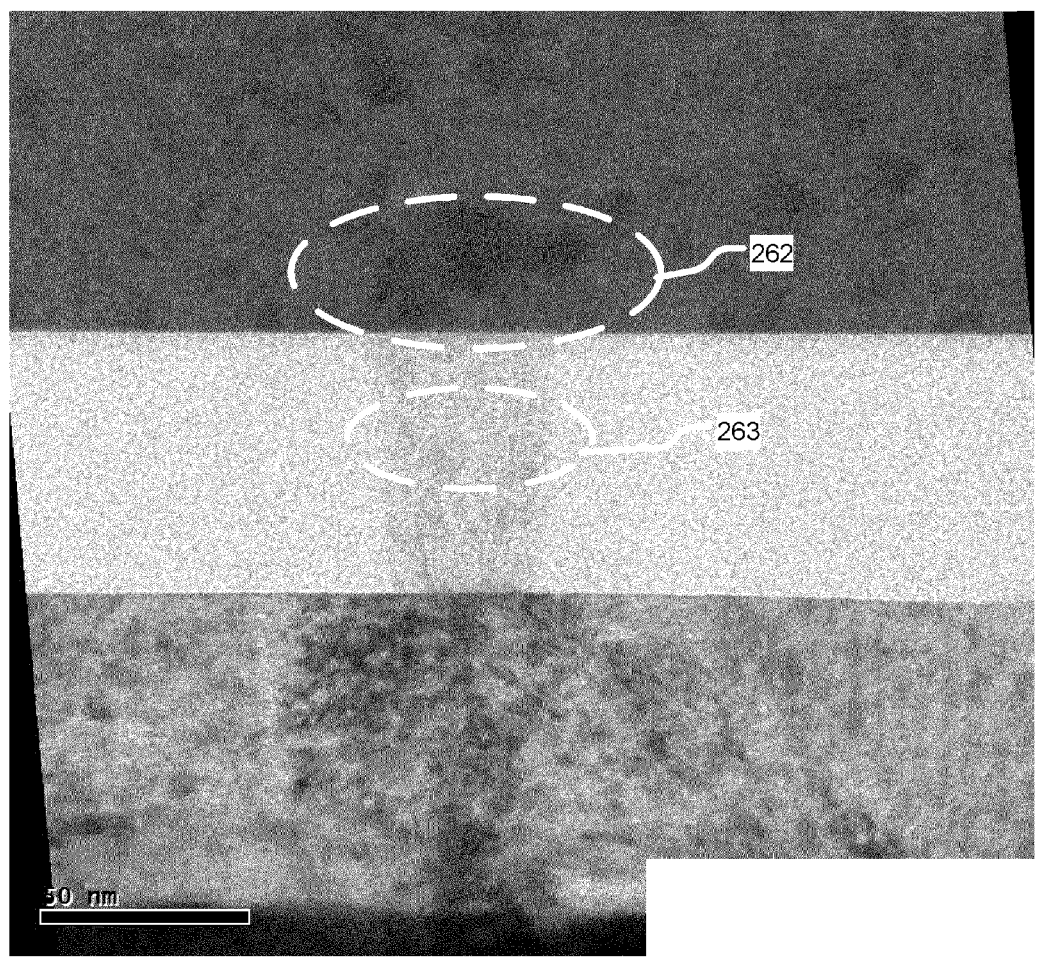
FIG. 22 is a TEM micrograph image of a memory cell with modified stoichiometry in the active region, caused by a forming pulse.

In a first example, sample devices having the structure of FIG. 2 having a bottom electrode with a diameter of about 50 nanometers coupled to a body of phase change material about 90 nanometers thick, were given a forming current pulse having a one millisecond pulse width with a 100 microseconds tail. The forming pulse was generated by applying a power supply voltage of 3.5 volts across the source line and bit line, while applying a voltage pulse across an MOS access transistor having a peak of 3 volts with the assigned shape. The cell is a mushroom cell having TiN bottom electrode with a contact surface having a diameter of about 50 nanometers contacting a body of phase change material that comprises $Ge_xSb_yTe_z$ material doped with 10 atomic percent (at %) silicon oxide and having a bulk stoichiometry in which $x=2$, $y=2$ and $z=5$. An image of the cell is shown in FIG. 22, discussed below. FIG. 15 is a log scale plot of the reset resistance ("triangle" samples 225) and set resistance ("x" samples 226) over set/reset cycle number for the cell. The plot shows that the set resistance is flat over the first $1 \times 10^6$ cycles, and begins to decrease thereafter. Likewise the reset resistance is flat over the first $1 \times 10^6$ cycles, and begins to decrease thereafter. The set resistance in this plot remains constant within a range of about 40 kOhms over a million set/reset cycles. Compared with the plot shown in FIG. 3, there is a surprising and substantial improvement in the stability of the cell, without reduction in the number of cycles before failure, at above $1 \times 10^8$ cycles.

Figure 16:
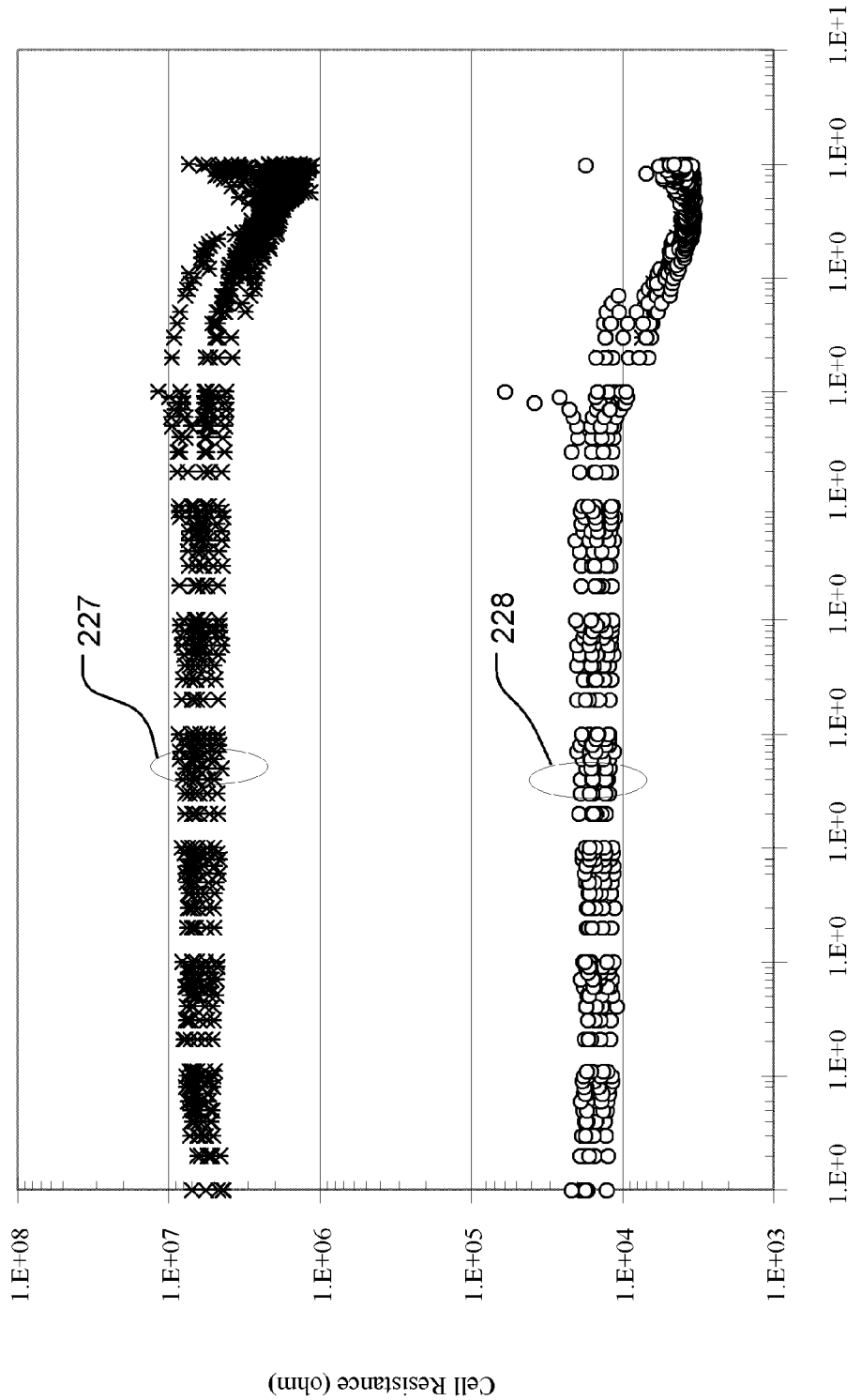
FIG. 16 is a plot of set and reset state resistance versus set/reset cycle number of a second example memory cell having a modified stoichiometry as described herein.

In a second example, sample devices having the structure of FIG. 2 were given a forming current as a sequence of 20 pulses having a one millisecond pulse width with a 100 microseconds tail, applied as described above with respect to FIG. 15. The cell is a mushroom cell having TiN bottom electrode with a contact surface having a diameter of about 50 nanometers contacting a body of phase change material that comprises $Ge_xSb_yTe_z$ material doped with 10 atomic percent (at %) silicon oxide and having a bulk stoichiometry in which $x=2$, $y=2$ and $z=5$. FIG. 16 is a log scale plot of the reset resistance ("six point asterisk" samples 227) and set resistance ("circle" samples 228) over set/reset cycle number for the cell after the forming current sequence. The plot shows that the set resistance is flat beyond the first $1 \times 10^6$ cycles, and begins to decrease thereafter. Likewise the reset resistance is flat beyond the first $1 \times 10^6$ cycles, and begins to decrease thereafter. The set resistance in this plot remains constant within a range of about 20 kOhms over a million set/reset cycles. Compared with the plot shown in FIG. 15, the starting levels are reduced significantly, and the cycle count at which the resistance begins to trail off is higher. Thus, this example forming current can provide for higher specified cycling for the device with more uniform set and reset resistances.

Figure 17:
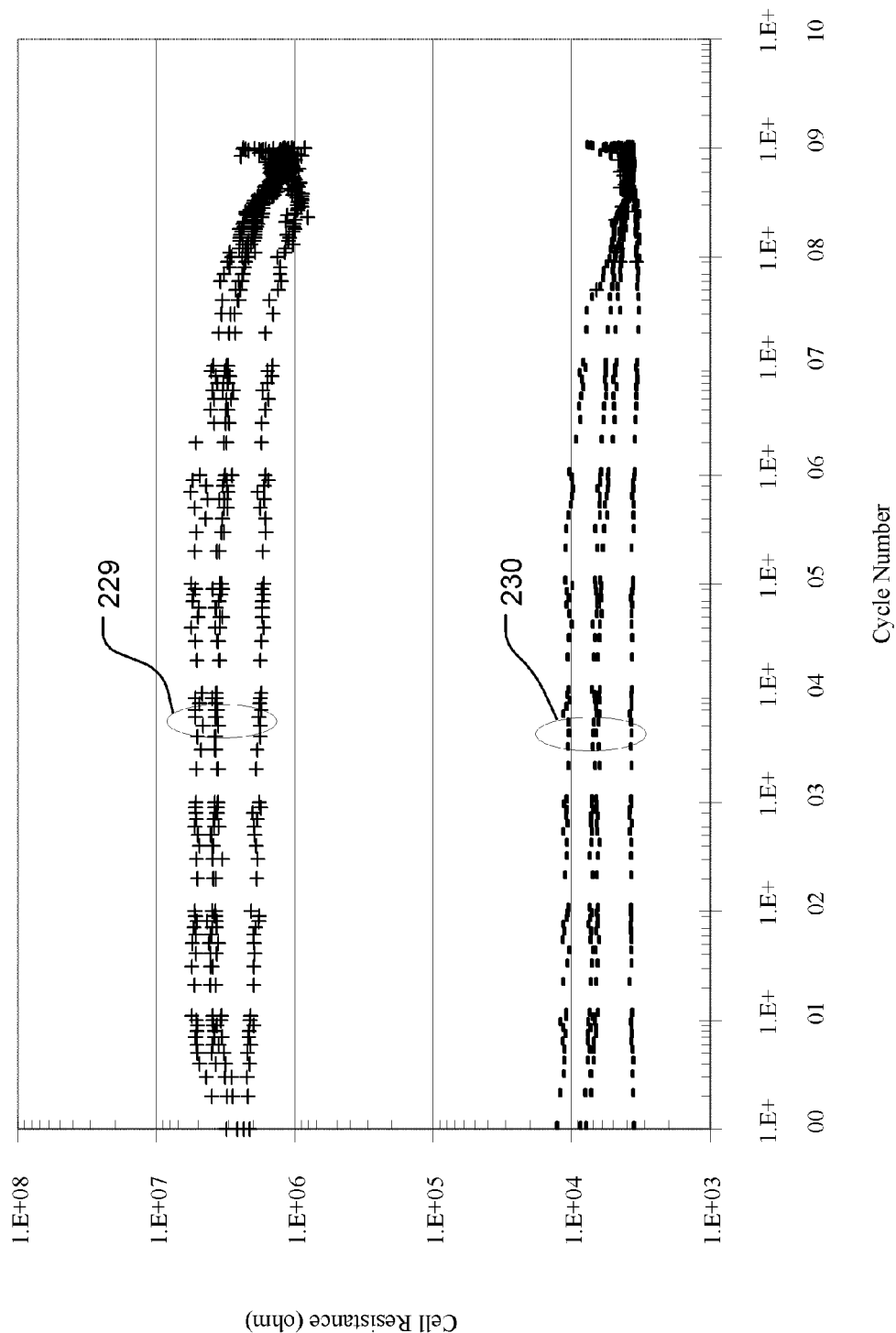
FIG. 17 is a plot of set and reset state resistance versus set/reset cycle number of a third example memory cell having a modified stoichiometry as described herein.

In a third example, sample devices having the structure of FIG. 2 were given a forming current pulse having a 200 millisecond pulse width with a 100 microseconds tail, applied as described above with reference to FIG. 15. The cell is a mushroom cell having a TiN bottom electrode with a contact surface having a diameter of about 50 nanometers contacting a body of phase change material that comprises $Ge_xSb_yTe_z$ material doped with 10 atomic percent (at %) silicon oxide and having a bulk stoichiometry in which $x=2$, $y=2$ and $z=5$. FIG. 17 is a log scale plot of the reset resistance ("+" samples 229) and set resistance ("–" samples 230) over set/reset cycle number for the cell. The plot shows that the set resistance is flat beyond the first $1 \times 10^7$ cycles, and begins to decrease thereafter. Likewise the reset resistance is flat beyond the first $1 \times 10^7$ cycles, and begins to decrease thereafter. The set resistance in this plot remains constant within a range of about 5 kOhms over a million set/reset cycles. Compared with the plot shown in FIG. 16, the starting levels are reduced significantly, and the cycle count at which the resistance begins to trail off is higher. Thus, this example forming current can provide for higher specified cycling for the device with more uniform set and reset resistances.

Figure 18:
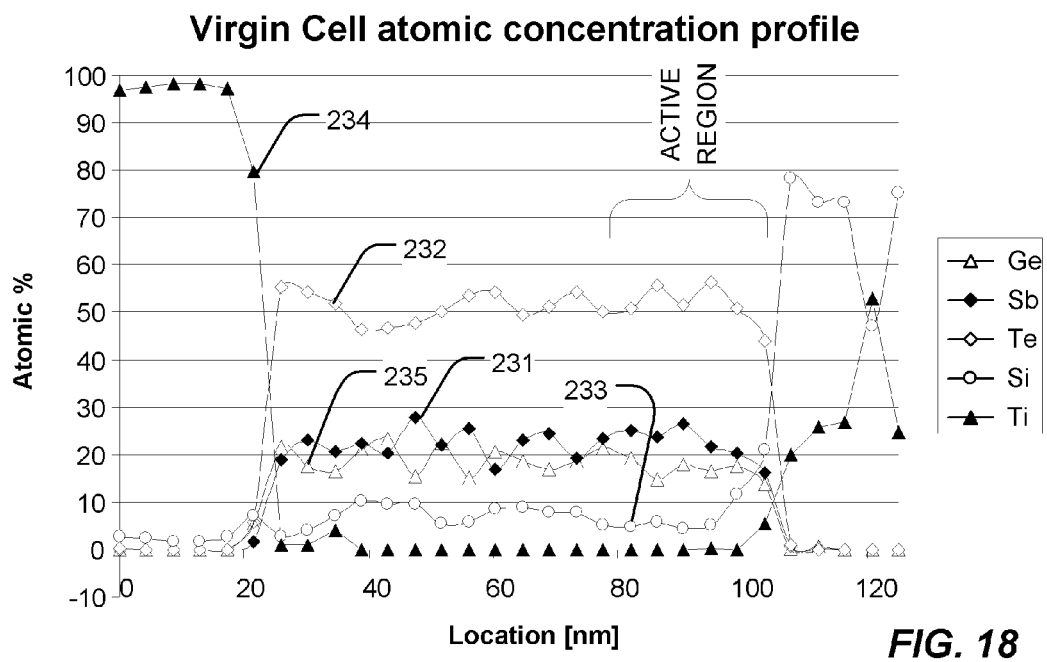
FIG. 18 is an EDX plot of atomic concentration profile for a body of phase change material in a memory cell without modified stoichiometry in the active region.

FIG. 18 is a graph of the atomic concentration profile of the body of phase change material for a cell having the structure shown in FIG. 2, before operation and without a forming pulse. The graph was generated using EDX, and shows the atomic percentages of Ge (light triangle samples 235), Sb (dark diamond samples 231), Te (light diamond samples 232), Si (circle samples 233) and Ti (dark triangle samples 234). The Ti samples show the locations of the top electrode at about 20 nanometers on the horizontal scale, and the bottom electrode at about 100 nanometers. The Si concentration is a reflection of the silicon oxide doping in the body of phase change material. The jump in Si concentration at the bottom electrode reflects the silicon in the silicon nitride dielectric layer. The concentrations of Ge and Sb are stable throughout the body of phase change material at about 20 atomic percent. Likewise the concentration of Te is constant at about 50 atomic percent. This shows the bulk stoichiometry of the virgin cell is consistent as expected for $Ge_2Sb_2Te_5$ material doped with 10 at % silicon oxide. The stoichiometry in the active region, in the location between about 80 and 100 nanometers, is the same as the bulk stoichiometry.

Figure 19:
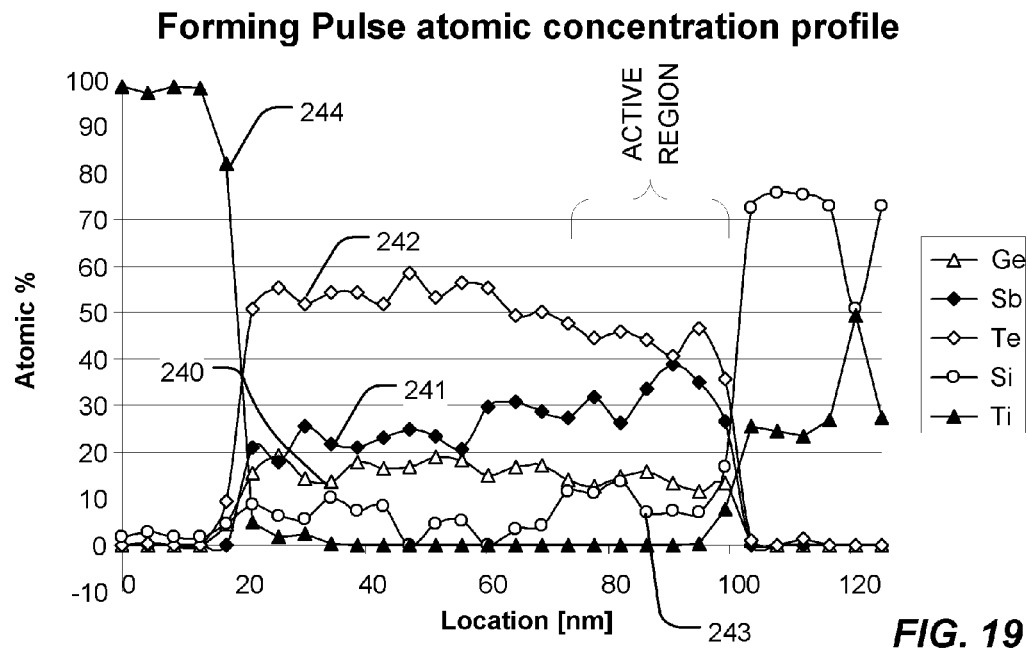
FIG. 19 is an EDX plot of atomic concentration profile for a body of phase change material in a memory cell with modified stoichiometry in the active region, caused by a forming pulse.

FIG. 19 is a graph of the atomic concentration profile of the body of phase change material for a cell having the structure shown in FIG. 2, after a forming pulse of about 1 millisecond duration with a 100 microseconds tail, as discussed above with respect to FIG. 15. The graph was generated using EDX, and shows the atomic percentages of Ge (light triangle samples 240), Sb (dark diamond samples 241), Te (light diamond samples 242), Si (circle samples 243) and Ti (dark triangle samples 244). The Ti samples show the locations of the top electrode at about 20 nanometers on the horizontal scale, and the bottom electrode at about 100 nanometers. The concentration of Ge is relatively stable throughout the body of phase change material at about 20 atomic percent. The concentration of Te is constant at about 50 atomic percent outside the active region, and falls to about 40 atomic percent within the active region. The concentration of Sb is constant about 20 atomic percent outside the active region, and increases to about 40 atomic percent within the active region. This shows the bulk stoichiometry outside the active region is consistent as expected for $Ge_xSb_yTe_z$ material doped with 10 at % silicon oxide, in which x=2, y=2 and z=5. There is a modified stoichiometry in the active region, in the location between about 80 and 100 nanometers, in which x=2, y>2 and z<5, and in some portions of the active region x=2, y=4 and z=4 (using as mentioned above, one significant digit in the atomic counts x, y and z).

Figure 20:
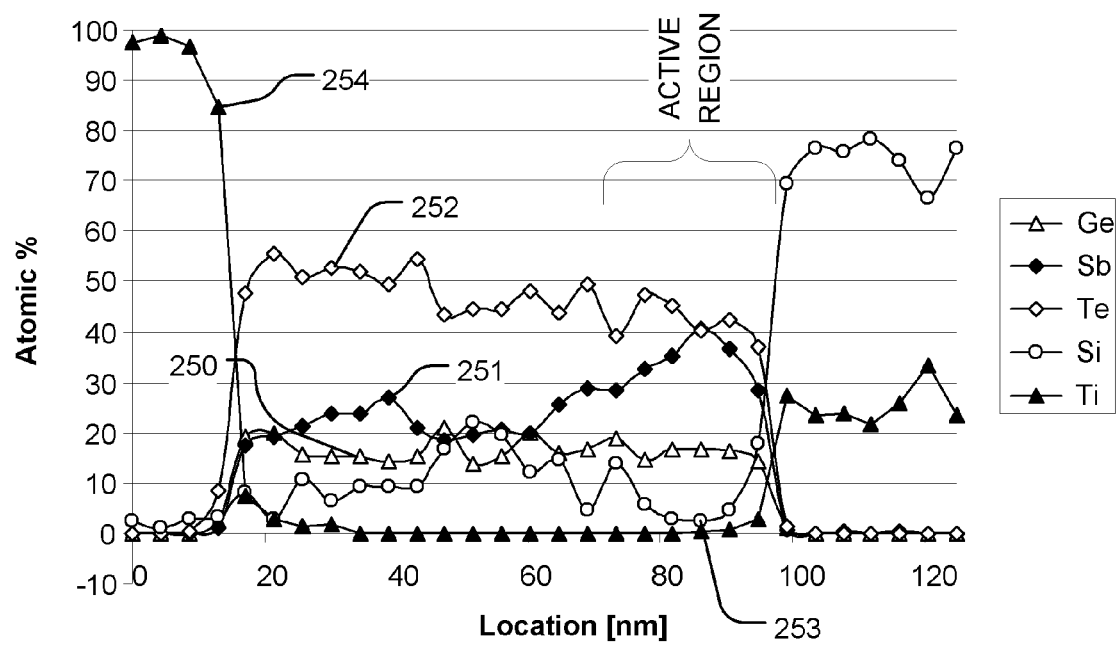
FIG. 20 is an EDX plot of atomic concentration profile for a body of phase change material in a memory cell with modified stoichiometry in the active region, caused by $1 \times 10^8$ set/reset cycles.

FIG. 20 is a graph of the atomic concentration profile of the body of phase change material for a cell having the structure shown in FIG. 2, after a billion set/reset cycles of the form described above with respect to FIG. 3. The graph was generated using EDX, and shows the atomic percentages of Ge (light triangle samples 250), Sb (dark diamond samples 251), Te (light diamond samples 252), Si (circle samples 253) and Ti (dark triangle samples 254). The Ti samples show the locations of the top electrode at about 20 nanometers on the horizontal scale, and the bottom electrode at about 100 nanometers. The concentration of Ge is relatively stable throughout the body of phase change material at about 20 atomic percent. The concentration of Te is constant at about 50 atomic percent outside the active region, and falls to about 40 atomic percent within the active region. The concentration of Sb is constant about 20 atomic percent outside the active region, and increases to about 40 atomic percent within the active region. This shows the bulk stoichiometry outside the active region is consistent as expected for $Ge_xSb_yTe_z$ material doped with 10 at % silicon oxide, in which x=2, y=2 and z=5. There is a modified stoichiometry in the active region, in the location between about 80 and 100 nanometers, in which in which x=2, y>2 and z<5, and in some portions of the active region x=2, y=4 and z=4. Thus, the forming pulse causes a transformation of the stoichiometry in the active region that is similar to the transformation caused by 100 million set/reset cycles. However, the transformation caused during the manufacturing process using a forming current, does not cause a consequential reduction of cycle endurance for the cell, as would be predicted by the plot of FIG. 3.

Figure 21:
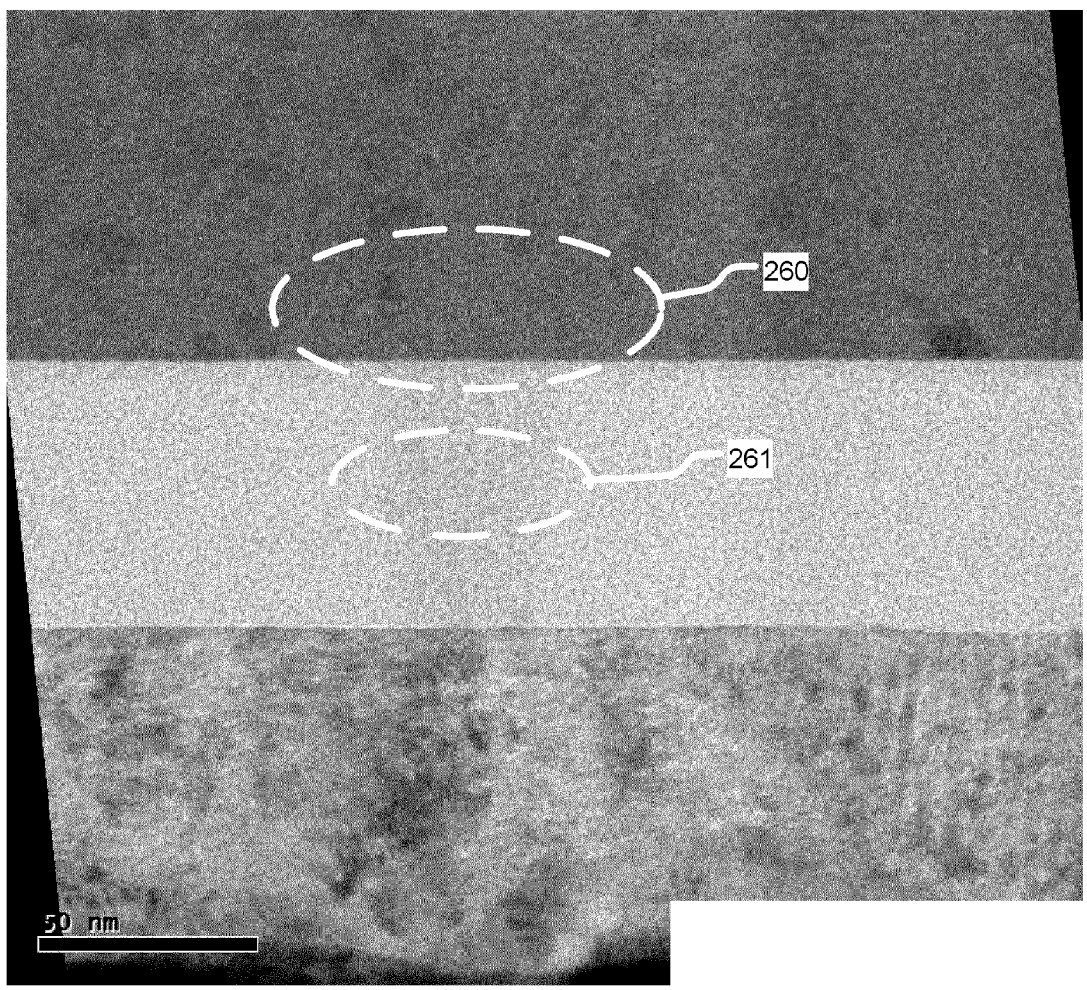
FIG. 21 is a TEM micrograph image of a memory cell without modified stoichiometry in the active region.
Figure 23:
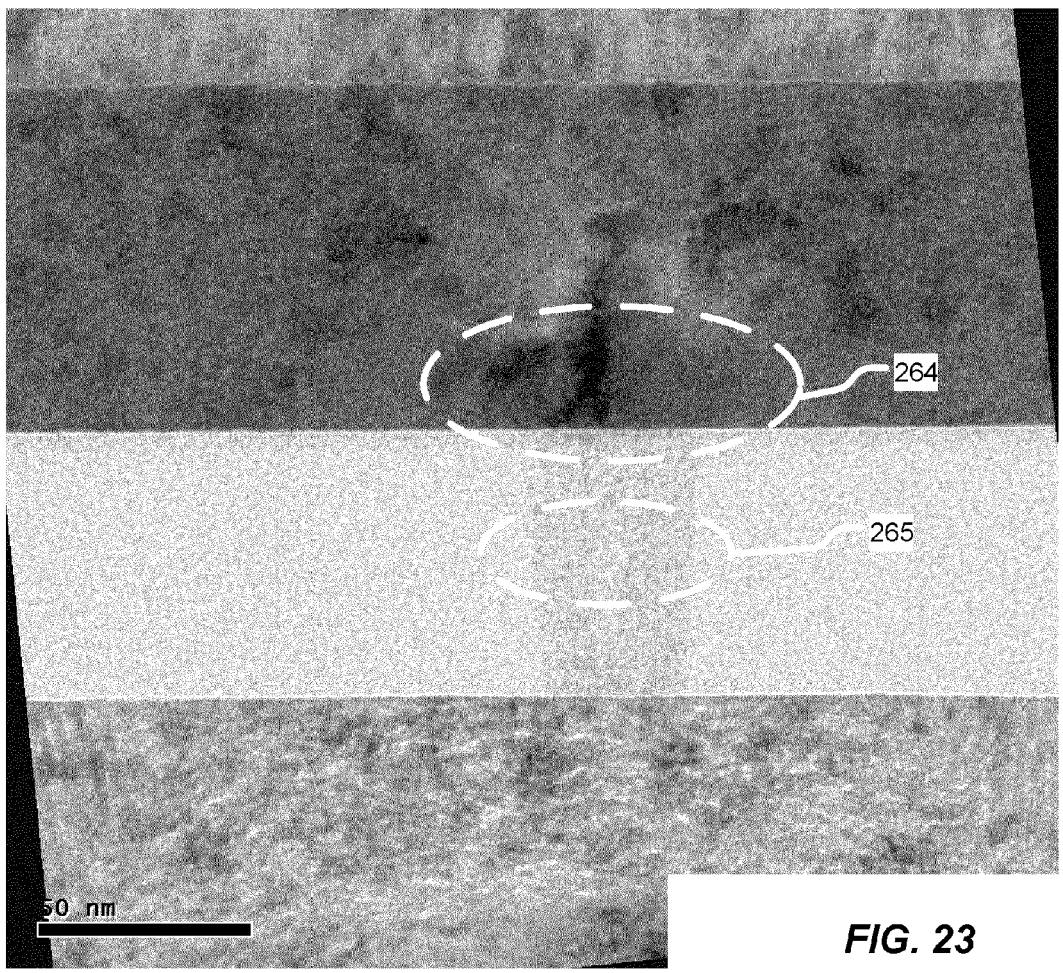
FIG. 23 is a TEM micrograph image of a memory cell with modified stoichiometry in the active region, caused by $1 \times 10^8$ set/reset cycles.

FIG. 21 is a TEM image of a virgin cell, showing a bottom electrode 261 having a contact surface about 50 nanometers in diameter, in contact with a body of phase change material, having an active region 260. The TEM image shows the uniform composition of the body of phase change material. FIG. 22 is a TEM image of a cell having been subjected to a forming current pulse having a one millisecond pulse width followed by a tail in the form of a ramped trailing edge 100 microseconds long. The image shows a bottom electrode 263 having a contact surface about 50 nanometers in diameter, in contact with a body of phase change material, having an active region 262. The modified stoichiometry in the active region is apparent from the image. FIG. 23 is a TEM image of a cell having been subjected to 100 million set/reset cycles. The image shows a bottom electrode 265 having a contact surface about 50 nanometers in diameter, in contact with a body of phase change material, having an active region 264. The modified stoichiometry in the active region is apparent from the image, and appears substantially the same as that in FIG. 22.

Figure 24:
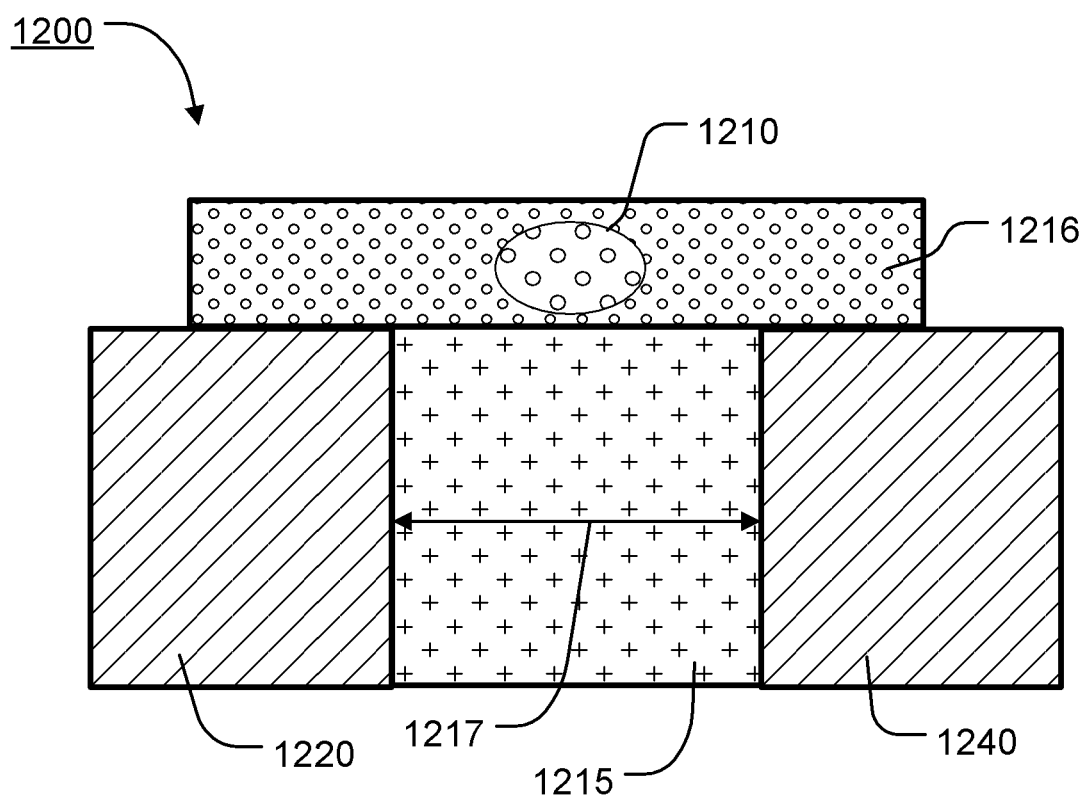
FIG. 24 illustrates a bridge type memory cell structure using a phase change material with a dielectric mesh in the active region as described herein.
Figure 25:
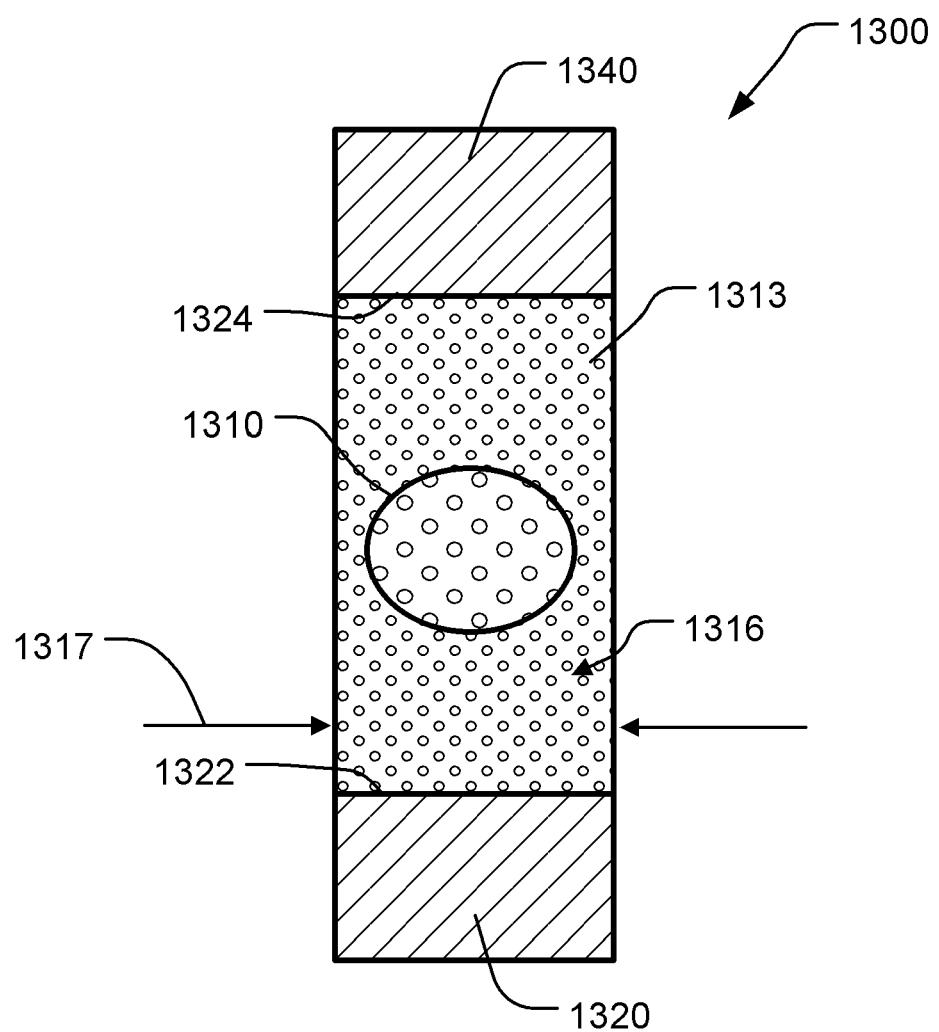
FIG. 25 illustrates an "active in via" type memory cell structure using a phase change material with a dielectric mesh in the active region as described herein.
Figure 26:
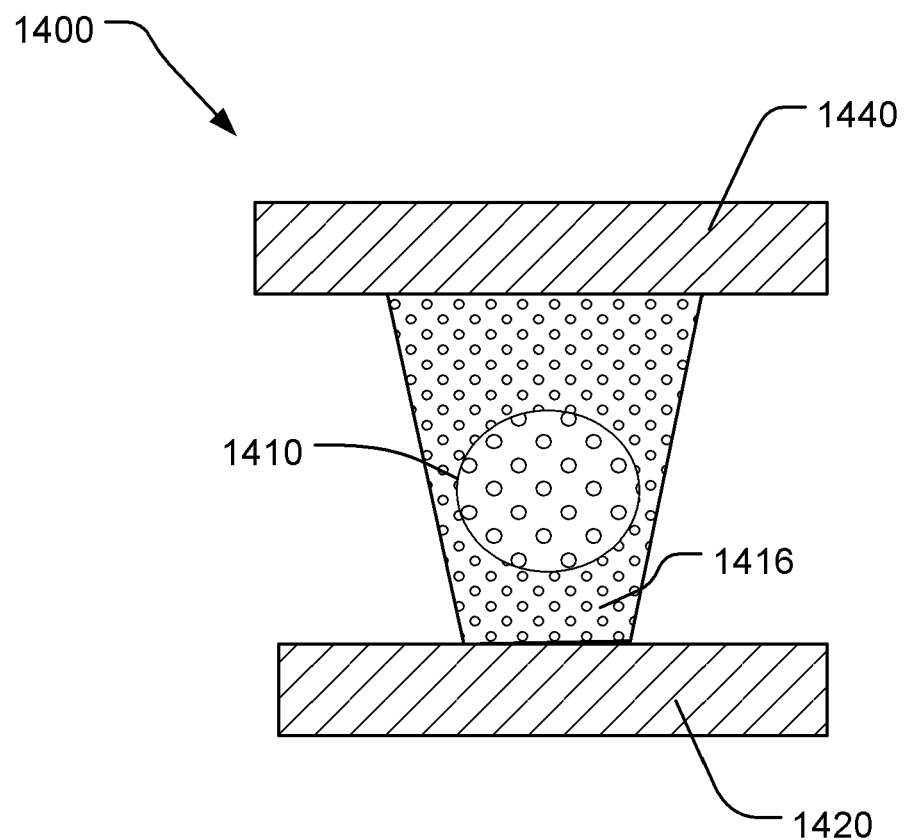
FIG. 26 illustrates a pore-type memory cell structure using a phase change material with a dielectric mesh in the active region as described herein.

FIGS. 24-26 illustrate memory cells that comprise a body of phase change material having a bulk stoichiometry, with an active region having a modified stoichiometry. The materials described above with reference to the elements of FIGS. 2 and 4 may be implemented in the memory cells of FIGS. 24-26, and thus a detailed description of these materials is not repeated.

FIG. 24 illustrates a cross-sectional view of a second memory cell 1200 having a body of phase change material with a bulk stoichiometry forming a bridge type memory element 1216, and having an active region 1210 with a modified stoichiometry as described above.

The memory cell 1200 includes a dielectric spacer 1215 separating first and second electrodes 1220, 1240. The memory element 1216 extends across the dielectric spacer 1215 to contact the first and second electrodes 1220, 1240, thereby defining an inter-electrode current path between the first and second electrodes 1220, 1240 having a path length defined by the width 1217 of the dielectric spacer 1215. In operation, as current passes between the first and second electrodes 1220, 1240 and through the memory element 1216, the active region 1210 heats up more quickly than the remainder of the memory element 1216.

FIG. 25 illustrates a cross-sectional view of a third memory cell 1300 having a body of phase change material with a bulk stoichiometry forming a pillar-shaped memory element 1316, and having an active region 1310 with a modified stoichiometry as described above.

The memory cell 1300 includes a pillar-shaped memory element 1316 contacting first and second electrodes 1320, 1340 at top and bottom surfaces 1322, 1324, respectively. The memory element 1316 has a width 1317 substantially the same in this example, as that of the first and second electrodes 1320, 1340 to define a multi-layer pillar surrounded by dielectric (not shown). As used herein, the term "substantially" is intended to accommodate manufacturing tolerances. In operation, as current passes between the first and second electrodes 1320, 1340 and through the memory element 1316, the active region 1310 heats up more quickly than the remainder 1313 of the memory element.

FIG. 26 illustrates a cross-sectional view of a fourth memory cell 1400 a body of phase change material with a bulk stoichiometry forming a pore-type memory element 1416, and having an active region 1410 with a modified stoichiometry as described above.

The memory cell 1400 includes a pore-type memory element 1416 surrounded by dielectric (not shown) contacting first and second electrodes 1420, 1440 at top and bottom surfaces respectively. The memory element has a width less than that of the first and second electrodes, and in operation as current passes between the first and second electrodes and through the memory element the active region heats up more quickly than the remainder of the memory element.

As will be understood, the present invention is not limited to the memory cell structures described herein and generally includes memory cells including a body of phase change material having a bulk stoichiometry, and having an active region with a modified stoichiometry so that the resulting structure is stabilized as described above.

Figure 27:
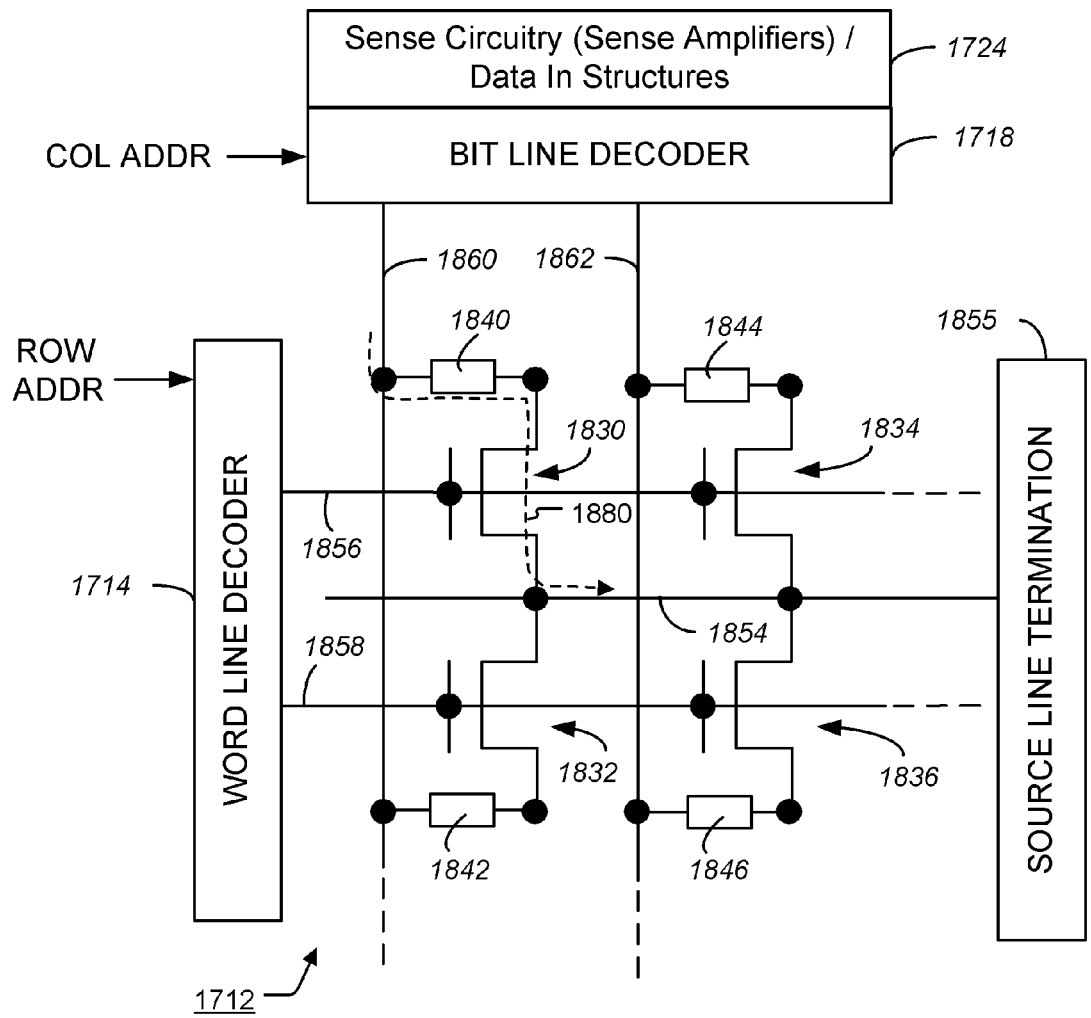
FIG. 27 is a simplified circuit diagram of a memory array including phase change memory cells as described herein.

In FIG. 27 four memory cells 1830, 1832, 1834, 1836 having stabilized memory elements 1840, 1842, 1844, 1846 are illustrated, representing a small section of an array.

Sources of each of the access transistors of memory cells 1830, 1832, 1834, 1836 are connected in common to source line 1854 that terminates in a source line termination circuit 1855, such as a ground terminal. In another embodiment the source lines of the access devices are not shared between adjacent cells, but independently controllable. The source line termination circuit 1855 may include bias circuitry such as voltage sources and current sources, and decoding circuits for applying bias arrangements, other than ground, to the source line 1854 in some embodiments.

A plurality of word lines including word lines 1856, 1858 extend in parallel along a first direction. Word lines 1856, 1858 are in electrical communication with word line decoder 1714. The gates of access transistors of memory cells 1830 and 1834 are connected to word line 1856, and the gates of access transistors of memory cells 1832 and 1836 are connected in common to word line 1858.

A plurality of bit lines including bit lines 1860, 1862 extend in parallel in a second direction and are in electrical communication with bit line decoder 1718. In the illustrated embodiment each of the memory elements are arranged between the drain of the corresponding access device and the corresponding bit line. Alternatively, the memory elements may be on the source side of the corresponding access device. Control circuitry and biasing circuits (see FIG. 28) are coupled to the array, and provide means for applying forming current to the memory cells to modify the stoichiometry an active region as described above.

FIG. 28 is a simplified block diagram of an integrated circuit 1710 including a memory array 1712 implemented using memory cells having an active region comprising phase change domains with a modified stoichiometry within a dielectric-rich mesh as described herein. A word line decoder 1714 having read, set and reset modes is coupled to and in electrical communication with a plurality of word lines 1716 arranged along rows in the memory array is 1712. A bit line (column) decoder 1718 is in electrical communication with a plurality of bit lines 1720 arranged along columns in the array 1712 for reading, setting, and resetting the phase change memory cells (not shown) in array 1712. Addresses are supplied on bus 1722 to word line decoder and drivers 1714 and bit line decoder 1718. Sense circuitry (Sense amplifiers) and data-in structures in block 1724, including voltage and/or current sources for the read, set, and reset modes are coupled to bit line decoder 1718 via data bus 1726. Data is supplied via a data-in line 1728 from input/output ports on integrated circuit 1710, or from other data sources internal or external to integrated circuit 1710, to data-in structures in block 1724. Other circuitry 1730 may be included on integrated circuit 1710, such as a general purpose processor or special purpose application circuitry, or a combination of modules providing system-on-a-chip functionality supported by array 1712. Data is supplied via a data-out line 1732 from the sense amplifiers in block 1724 to input/output ports on integrated circuit 1710, or to other data destinations internal or external to integrated circuit 1710.

A controller 1734 implemented in this example, using a bias arrangement state machine, controls the application of bias circuitry voltage and current sources 1736 for the application of bias arrangements including read, program, erase, erase verify and program verify voltages and/or currents for the word lines and bit lines. In addition, bias arrangements for applying the forming current are implemented as mentioned above. Controller 1734 may be implemented using special-purpose logic circuitry as known in the art. In alternative embodiments, controller 1734 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1734.

The forming pulse and bias circuitry voltage and current sources in block 1736 can be implemented using power supply inputs with voltage dividers and charge pumps, current source circuitry, pulse shaping circuitry, timing circuitry and voltage and current switches as are standard in the art.

The controller 1734 in the forming pulse and bias circuitry voltage and current sources at block 1736 provide a means for applying forming current to induce modification of the stoichiometry in the active region as described above.

As shown in FIG. 28, each of the memory cells of array 1712 includes an access transistor (or other access device such as a diode) and memory element having an active region comprising phase change material with a stabilized stoichiometry as described above.

It will be understood that the memory array 1712 is not limited to the array configuration illustrated in FIG. 27, and additional array configurations can also be used. Additionally, instead of MOS transistors bipolar transistors or diodes may be used as access devices in some embodiments.

In operation each of the memory cells in the array 1712 store data depending upon the resistance of the corresponding memory element. The data value may be determined, for example, by comparison of current on a bit line for a selected memory cell to that of a suitable reference current by sense amplifiers of sense circuitry 1724. The reference current can be established to that a predetermined range of currents correspond to a logical "0", and a differing range of current correspond to a logical "1".

Reading or writing to a memory cell of array 1712, therefore, can be achieved by applying a suitable voltage to one of word lines and coupling one of bit lines to a voltage source so that current flows through the selected memory cell. In FIG. 27 an example is shown in which a current path 1880 through a selected memory cell (in this example memory cell 1830 and corresponding memory element 1840) is established by applying voltages to the bit line 1860, word line 1856, and source line 1854 sufficient to turn on the access transistor of memory cell 1830 and induce current in path 1880 to flow from the bit line 1860 to the source line 1854, or vice-versa. The level and duration of the voltages applied is dependent upon the operation performed, e.g. a reading operation or a writing operation.

In a reset (or erase) operation of the memory cell, word line decoder 1714 facilitates providing a word line with a suitable voltage pulse to turn on the access transistor of the memory cell. Bit line decoder 1718 facilitates supplying a voltage pulse to a bit line of suitable amplitude and duration to induce a current to flow though the memory element, the current raising the temperature of the active region of the memory element above the transition temperature of the phase change material and also above the melting temperature to place the phase change material of the active region in a liquid state. The current is then terminated, for example by terminating the voltage pulses on the bit line and on the word line, resulting in a relatively quick quenching time as the active region cools to a high resistance generally amorphous phase in the phase change domains of the active region to establish a high resistance reset state in the memory cell. The reset operation can also comprise more than one pulse, for example using a pair of pulses.

In a set (or program) operation of the selected memory cell, word line decoder 1714 facilitates providing a word line with a suitable voltage pulse to turn on the access transistor of the memory cell. Bit line decoder 1718 facilitates supplying a voltage pulse to a bit line of suitable amplitude and duration to induce a current to flow through the memory element, the current pulse sufficient to raise the temperature of the active region above the transition temperature and cause a transition in the phase change domains of the active region from the high resistance generally amorphous condition into a low resistance generally crystalline condition, this transition lowering the resistance of all of the memory element and setting the memory cell to the low resistance state.

In a read (or sense) operation of the data value stored in the memory cell, word line decoder 1714 facilitates providing a word line with a suitable voltage pulse to turn on the access transistor of the memory cell. Bit line decoder 1718 facilitates supplying a voltage to a bit line of suitable amplitude and duration to induce current to flow through the memory element that does not result in the memory element undergoing a change in resistive state. The current on the bit line and through the memory cell is dependent upon the resistance of, and therefore the data state associated with, the memory cell. Thus, the data state of the memory cell may be determined by detecting whether the resistance of the memory cell corresponds to the high resistance state or the low resistance state, for example by comparison of the current on the corresponding bit line with a suitable reference current by sense amplifiers of sense circuitry 1724.

In a forming pulse mode, the control circuitry in controller 1734 and a bias circuitry in block 1736 are enabled to execute a procedure for cycling through the array of phase change memory cells, and applying forming current to induce the modification of the stoichiometry in the active regions. The control circuitry can be enabled in representative systems by control signals provided using contact probes with manufacturing equipment in the testing line after separation of the die into individual chips. The control circuitry and a bias circuitry can be enabled in other systems using manufacturing equipment after packaging of the die, using input pads operated in a forming mode which is similar to a testing mode for the chip. In addition, the equipment can be configured to apply forming currents to multiple cells at the same time, so that the total process time for the forming procedure 1040 in FIG. 5 can be reduced thus improve the throughput.

The phase change materials used in the embodiment described herein consist of silicon oxide and $G_2S_2T_5$. Other phase change alloys including chalcogenides may be used as well. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112 cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference. Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g. U.S. Pat. No. 6,800,504, and U.S. Patent Application Publication No. US 2005/0029502.

Representative chalcogenide material can have a bulk stoichiometry characterized as follows: $Ge_xSb_yTe_z$, where x:y:z=2:2:5. Other compositions can be used with x: 0~5; y: 0~5; z: 0~10. GeSbTe with doping, such as N—, Si—, Ti—, or other element doping, may also be used. These materials can be formed by PVD sputtering or magnetron-sputtering with reactive gases of Ar, $N_2$, and/or He, etc. and chalcogenide at the pressure of 1 mtorr~100 mtorr. The deposition is usually done at room temperature. A collimator with an aspect ratio of 1~5 can be used to improve the fill-in performance. To improve the fill-in performance, the DC bias of several tens of volts to several hundreds of volts is also used. Also, the combination of DC bias and the collimator can be used simultaneously. A post deposition annealing treatment with vacuum or $N_2$ ambient is sometimes needed to improve the crystallized state of chalcogenide material. The annealing temperature typically ranges 100° C. to 400° C. with an anneal time of less than 30 minutes.

The thickness of the chalcogenide material depends on the design of the cell structure. In general, a chalcogenide material with thickness of higher than 8 nm can have a phase change characterization such that the material exhibits at least two stable resistance states, although thinner layers may be suitable for some embodiments.

For memory cells implemented using GST or similar chalcogenides, suitable materials for implementing the electrodes in the illustrated embodiments include TiN, TaN, W and doped Si. Alternatively, the electrodes are TiAlN or TaAlN, or comprise, for further examples, one or more elements selected from the group consisting of Ti, W, Mo, Al, Ta, Cu, Pt, Ir, La, Ni, and Ru and alloys thereof.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for manufacturing an integrated circuit, comprising:

providing an array of phase change memory cells on an integrated circuit substrate, the phase change memory cells having respective first and second electrodes with active regions within bodies of phase change material having a bulk stoichiometry between the first and second electrodes;

providing bias circuitry to set and reset the phase change memory cells in the array by applying set and reset pulses to cause the phase change memory cells to transform to a set state resistance or a reset state resistance; and applying forming current after forming the first and second electrodes to the phase change memory cells in the array to form a phase change material in the respective active regions having a modified stoichiometry, the modified stoichiometry in the respective active regions being different than the bulk stoichiometry outside the respective active regions and between the first and second electrodes, the forming current being induced by a forming pulse that is different from the set pulse and different from the reset pulse, and applied before the set and reset pulses are applied, wherein said applying forming current includes applying a pulse having a duration greater than 0.5 milliseconds, or a pulse having a current magnitude sufficient to cause a temperature in the active region greater than a melting temperature for the phase change material for a first duration, with a sloped trailing edge in which the current magnitude drops over a time interval significantly greater than a quench cutoff for the phase change material.

2. The method of claim 1, wherein after applying said forming current, the phase change memory cells in the array have a resistance in a set state which remains within a range less than 20 kOhm wide over one million set and reset cycles.

3. The method of claim 1, wherein after applying said forming current, the phase change memory cells in the array have a resistance in a set state which remains within a range less than 20 kOhm wide over ten million set and reset cycles.

4. The method of claim 1, wherein said duration is greater than 100 milliseconds.

5. The method of claim 1, wherein said phase change material comprises a chalcogenide material doped with a dielectric material.

6. The method of claim 1, wherein the phase change material comprises GexSbyTez.

7. The method of claim 1, wherein the phase change material comprises GexSbyTez, where x=2, y=2 and z=5 in the bulk stoichiometry.

8. The method of claim 7, where y>2 and z<5 in the modified stoichiometry.

* * * * *